United States Patent
Kim et al.

(10) Patent No.: US 8,928,385 B2
(45) Date of Patent: Jan. 6, 2015

(54) METHODS OF CONTROLLING CLOCKS IN SYSTEM ON CHIP INCLUDING FUNCTION BLOCKS, SYSTEMS ON CHIPS AND SEMICONDUCTOR SYSTEMS INCLUDING THE SAME

(71) Applicants: Dong Keun Kim, Seoul (KR); Sun Cheol Kwon, Yongin-si (KR); Si Young Kim, Seoul (KR); Jae Gon Lee, Suwon-si (KR); Jung Hun Heo, Suwon-si (KR)

(72) Inventors: Dong Keun Kim, Seoul (KR); Sun Cheol Kwon, Yongin-si (KR); Si Young Kim, Seoul (KR); Jae Gon Lee, Suwon-si (KR); Jung Hun Heo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/687,637

(22) Filed: Nov. 28, 2012

(65) Prior Publication Data
US 2013/0147526 A1   Jun. 13, 2013

(30) Foreign Application Priority Data
Dec. 12, 2011   (KR) .......................... 10-2011-0133195

(51) Int. Cl.
| | |
|---|---|
| H03K 3/00 | (2006.01) |
| H03K 21/00 | (2006.01) |
| G06F 1/32 | (2006.01) |
| G06F 1/08 | (2006.01) |
| H03K 19/00 | (2006.01) |
| H03K 21/10 | (2006.01) |

(52) U.S. Cl.
CPC ................ *H03K 21/00* (2013.01); *G06F 1/324* (2013.01); *G06F 1/08* (2013.01); *H03K 19/0016* (2013.01); *H03K 21/10* (2013.01)
USPC ............ 327/291; 327/117; 327/115; 327/114

(58) Field of Classification Search
USPC .......................... 327/114, 117, 115, 291–299
See application file for complete search history.

(56) References Cited

U.S. PATENT DOCUMENTS

| | | | | |
|---|---|---|---|---|
| 4,947,411 | A | * | 8/1990 | Shiraishi et al. ................. 377/47 |
| 5,301,306 | A | * | 4/1994 | Plog .............................. 713/501 |
| 5,729,766 | A | * | 3/1998 | Cohen ............................. 710/58 |
| 6,922,111 | B2 | * | 7/2005 | Kurd et al. ...................... 331/48 |
| 7,171,577 | B2 | * | 1/2007 | Cheung et al. ................ 713/501 |
| 7,594,126 | B2 | | 9/2009 | Yun et al. |
| 7,602,226 | B1 | * | 10/2009 | Hwang et al. ................. 327/291 |

FOREIGN PATENT DOCUMENTS

| | | |
|---|---|---|
| JP | 2004206480 A | 7/2004 |
| JP | 2008123402 A | 5/2008 |

* cited by examiner

*Primary Examiner* — Lincoln Donovan
*Assistant Examiner* — Thomas Skibinski
(74) *Attorney, Agent, or Firm* — Harness, Dickey & Pierce, P.L.C.

(57) ABSTRACT

A system-on-chip includes a clock controller configured to decrease an operating frequency of at least one function block based on a change in an operating state of the at least one function block from an active state to an idle state. In a method of operating a system-on-chip including at least one function block, an operating frequency of the at least one function block is decreased based on a change in an operating state of the at least one function block from an active state to an idle state. The decreased operating frequency is greater than zero.

35 Claims, 22 Drawing Sheets

METHODS OF CONTROLLING CLOCKS IN SYSTEM ON CHIP INCLUDING FUNCTION BLOCKS, SYSTEMS ON CHIPS AND SEMICONDUCTOR SYSTEMS INCLUDING THE SAME

CROSS-REFERENCE TO RELATED APPLICATION(S)

This application claims priority under 35 U.S.C. §119(a) to Korean Patent Application No. 10-2011-0133195 filed on Dec. 12, 2011, the disclosure of which is hereby incorporated by reference in its entirety.

BACKGROUND

1. Field

Example embodiments of inventive concepts relate to systems on chips (SoCs), for example, to methods of controlling operating clock signals provided to function blocks in SoCs, SoCs using the method and/or semiconductor systems including the SoCs.

2. Description of Related Art

A system-on-chip (SoC) is semiconductor integration technology for implementing relatively complicated components having different functions in a single system. A SoC includes a processor, which controls the entire system, and various intellectual properties (IPs) controlled by the processor. Here, an IP is a circuit, a logic or a combination thereof, which can be integrated into the SoC. Code may be stored in the circuit or logic.

Systems including a SoC having a plurality of various IPs are usually driven by a battery. Consequently, low-power design is relatively important. When a reference clock signal is provided to the SoC by, for example, a phase locked loop (PLL), each of the IPs operates in response to an operating clock signal having a different frequency according to its function.

Each IP may be in an active state or an idle mode according to the function of the IP. And, different IPs may operate in different modes (e.g., idle or active) concurrently or simultaneously.

When at least one IP is in the active state and at least one IP is in the idle mode, an operating clock signal for the active state is applied to the at least one IP in the idle mode as if the IP in the idle mode is in the active state. In this instance, the SoC consumes unnecessary power. The unnecessary consumption of power may affect the lifespan of a battery, for example, when a frequency of several hundreds of MHz to several GHz is used.

SUMMARY

At least one example embodiment provides a method of operating a system-on-chip including at least one function block. According to at least this example embodiment, the method includes: decreasing an operating frequency of the at least one function block based on a change in an operating state of the at least one function block from an active state to an idle state, the decreased operating frequency being greater than zero.

At least one other example embodiment provides a method of operating a system-on-chip including a function block. According to at least this example embodiment, the method includes: detecting a first change in an operating state of the function block from an active state to an inactive state; decreasing an operating frequency of the function block in response to the detected first change, the decreased operating frequency being greater than zero; detecting a second change in the operating state of the function block from the inactive state to the active state; and increasing the operating frequency of the function block in response to the detected second change from the inactive state to the active state.

At least one other example embodiment provides a system-on-chip. According to at least this example embodiment the system-on-chip includes: a clock controller configured to decrease an operating frequency of at least one function block based on a change in an operating state of the at least one function block from an active state to an idle state, the decreased operating frequency being greater than zero.

At least one other example embodiment provides a system-on-chip. According to at least this example embodiment, the system-on-chip includes: a mode detector circuit configured to detect a change in an operating state of a function block, the mode detector circuit being further configured to generate a select signal based on the detected change in the operating state; and an operating frequency setting circuit configured to set an operating frequency of the function block based on the select signal from the mode detector circuit; wherein the operating frequency setting circuit is configured to decrease the operating frequency of the function block if the select signal is indicative of a change from an active operating state to an inactive operating state, the decreased operating frequency being greater than zero, and the operating frequency setting circuit is configured to increase the operating frequency of the function block if the select signal is indicative of a change from the inactive operating state to the active operating state.

At least one other example embodiment provides a semiconductor system. According to at least this example embodiment, the semiconductor system includes: a system-on-chip; a memory configured to store at least one of programs and data associated with the semiconductor system; at least one processor configured to at least one of process and execute at least one of the programs and data stored in the memory; a memory controller configured to interface with external memory; and a display device controller configured to control a display device. The system-on-chip includes a clock controller configured to decrease an operating frequency of at least one function block based on a change in an operating state of the at least one function block from an active state to an idle state, the decreased operating frequency being greater than zero.

At least one other example embodiment provides a semiconductor system. According to at least this example embodiment, the semiconductor system includes: a display device; a radio transceiver configured to transmit and receive radio signals via an antenna; and a system-on-chip configured to interface with the radio transceiver and the display device. The system-on-chip includes: a clock controller configured to decrease an operating frequency of at least one function block based on a change in an operating state of the at least one function block from an active state to an idle state, the decreased operating frequency being greater than zero.

At least one other example embodiment provides a computer system. According to at least this example embodiment, the computer system includes: a display device; a memory device; a memory controller configured to control the memory device; an input device; and a system-on-chip configured to interface with the display device, the memory controller and the input device. The system-on-chip includes a clock controller configured to decrease an operating frequency of at least one function block based on a change in an operating state of the at least one function block from an active state to an idle state, the decreased operating frequency being greater than zero.

At least one other example embodiment provides a computer system. According to at least this example embodiment, the computer system includes: a display device; an image sensor; a memory device; a memory controller configured to control the memory device; and a system-on-chip configured to interface with the display device, the image sensor and the memory controller. The system-on-chip includes: a clock controller configured to decrease an operating frequency of at least one function block based on a change in an operating state of the at least one function block from an active state to an idle state, the decreased operating frequency being greater than zero.

At least one other example embodiment provides a memory system. According to at least this example embodiment, the memory system includes: a host; a volatile memory device; a plurality of non-volatile memory devices; a memory controller configured to control the plurality of non-volatile memory devices; and a system-on-chip configured to interface with the host, the volatile memory device and the memory controller. The system-on-chip includes a clock controller configured to decrease an operating frequency of at least one function block based on a change in an operating state of the at least one function block from an active state to an idle state, the decreased operating frequency being greater than zero.

BRIEF DESCRIPTION OF THE DRAWINGS

Inventive concepts will become more apparent by describing in detail some example embodiments thereof with reference to the attached drawings in which.

DETAILED DESCRIPTION

Figure 1:
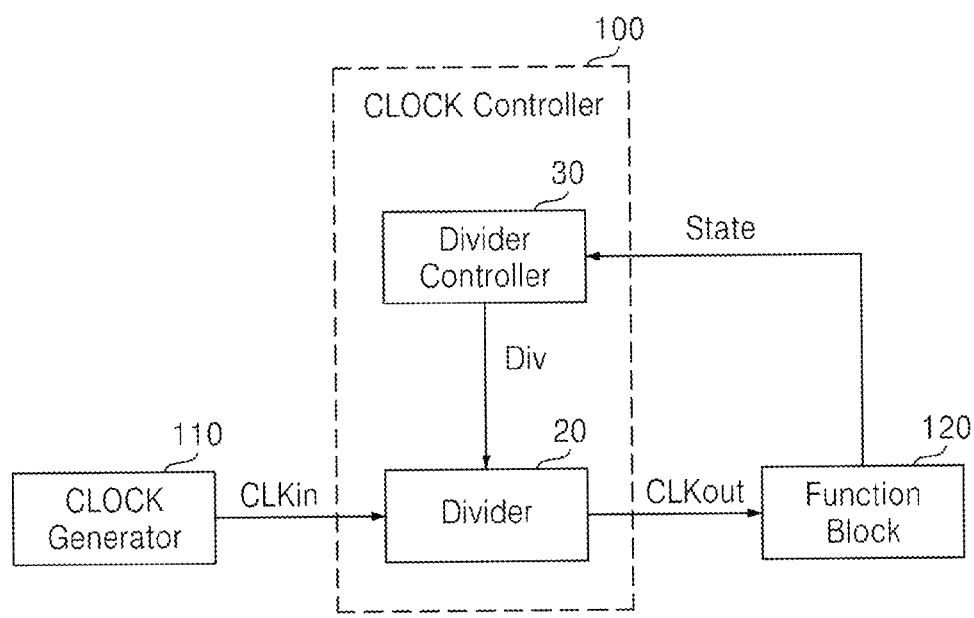
FIG. 1 is a block diagram of a system on chip (SoC) according to an example embodiment of inventive concepts.

Inventive concepts now will be described more fully hereinafter with reference to the accompanying drawings, in which example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Specific details are provided in the following description to provide a thorough understanding of example embodiments. However, it will be understood by one of ordinary skill in the art that example embodiments may be practiced without these specific details. For example, systems (e.g., computer systems, systems-on-chips, etc.) may be shown in block diagrams in order not to obscure the example embodiments in unnecessary detail. In other instances, well-known processes, structures and techniques may be shown without unnecessary detail in order to avoid obscuring example embodiments.

Also, example embodiments may be described as processes depicted as flowcharts, structure diagrams, block diagrams, etc. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

At least some example embodiments may be implemented by hardware, software, firmware, middleware, microcode, hardware description languages, or any combination thereof When implemented in software, firmware, middleware or microcode, the program code or code segments to perform the necessary tasks may be stored in a machine or computer readable medium such as a storage medium. A processor(s) may perform the necessary tasks.

The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, wireless channels and various other mediums capable of storing, containing or carrying instruction(s) and/or data.

A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system on chip (SoC) 10 according to an example embodiment of inventive concepts.

Referring to FIG. 1, the SoC 10 includes a clock generator 110, a clock controller 100 and a function block 120. The SoC 10 may be manufactured as a single chip in a single package. For clarity of the description, the SoC 10 including the clock generator 110, the clock controller 100 and the function block 120 is illustrated in FIG. 1, but inventive concepts are not restricted thereto.

According to at least one example embodiment, the clock controller 100 is configured to decrease an operating frequency of at least one function block based on a change in an operating state of the at least one function block from an active state to an idle state, the decreased operating frequency being greater than zero.

According to at least one other example embodiment, the clock controller 100 is configured to: detect a change in an operating state of a function block 120 from an active state to an inactive state (e.g., idle state); decrease an operating frequency of the function block 120 in response to the detected change, wherein the decreased operating frequency is greater than zero; detect a change in the operating state of the function block 120 from the inactive state to the active state; and increase the operating frequency of the function block 120 in response to the detected change from the inactive state to the active state.

In more detail with regard to FIG. 1, the clock generator 110 generates a reference clock signal CLKin having a reference frequency for the operation of the SoC 10. The clock generator 110 outputs the reference clock signal CLKin to the clock controller 100.

The clock controller 100 monitors the state of the function block 120 and sets an operating frequency of an operating clock signal CLKout according to the monitored state of the function block 120. The clock controller 100 outputs the operating clock signal CLKout to the function block 120.

When the function block 120 is in the idle state, the clock controller 100 outputs an operating clock signal CLKout having a first (idle mode) frequency (e.g., a given, desired or predetermined first frequency). When the function block 120 is in the active state, the clock controller 100 outputs the operating clock signal CLKout having a second (active mode) frequency (e.g., a given, desired or predetermined second frequency) or third (wakeup mode) frequency (e.g., a given, desired or predetermined third frequency). In one example, when the function block 120 transitions from the idle state to the active state, the clock controller 100 outputs an operating clock signal CLKout having the third frequency.

According to at least some example embodiments, the first through third frequencies are greater than 0, and at least two of the three frequencies are different from one another. According to at least some other example embodiments, the first through third frequencies are greater than 0 and different from one another. The operating frequencies may gradually increase in order of the first frequency (sometimes referred to herein as the "idle mode frequency" or "idle mode operating frequency"), the third frequency (sometimes referred to herein as the "wakeup mode frequency" or "wakeup mode operating frequency"), and the second frequency (sometimes referred to herein as the "active mode frequency" or "active mode operating frequency"). For example, the wakeup mode frequency is greater than the idle mode frequency, and the active mode frequency is greater than the wakeup mode frequency. Again, each of the idle mode frequency, the wakeup mode frequency, and the active mode frequency has a value greater 0, and the frequencies may be different from one another.

Still referring to FIG. 1, the clock controller 100 includes a divider 20 and a divider controller 30.

The divider controller 30 monitors the state of the function block 120, and outputs a division factor Div based on the monitored state of the function block 120. The divider 20 sets the operating frequency of the operating clock signal CLKout to a frequency obtained by dividing the reference frequency by the division factor Div, and outputs the operating clock signal CLKout having the obtained operating frequency. The divider controller 30 monitors the state of the function block 120 based on the state signal State output from the function block 120.

In one example, when the state signal State output from the function block 120 is high (e.g., a logic high or '1'), the divider controller 30 determines that the function block 120 is in the active state. On the other hand, when the state signal State output from the function block 120 is low (e.g., a logic low or '0'), the divider controller 30 determines that the function block 120 is in the idle state. The function block 120 performs data processing operations in the SoC 10. Although only one function block 120 is illustrated in FIG. 1, inventive concepts are not restricted to only this example embodiment. The SoC 10 may include a plurality of function blocks.

According to at least some example embodiments, the function block 120 may be a processor controlling the entire SoC 10 or one of various intellectual properties (IPs) controlled by the processor. Examples of the IPs include a central processing unit (CPU), cores of a CPU, a graphics processing unit (GPU), a multi-format codec (MFC), a video module (e.g., a camera interface, a Joint Photographic Experts Group (JPEG) processor, a video processor, a mixer, etc.), an audio system, a driver, a display driver, a volatile memory device, non-volatile memory, a memory controller, cache memory, a serial port, a system timer, a watchdog timer, an analog-to-digital converter, etc. Function blocks 120 may have different operating clock frequencies and/or different operating clock frequency requirements, and therefore, different operating clock signals CLKout may be used in the SoC 10.

According to at least some example embodiments, the SoC 10 may be implemented by an integrated circuit (IC). The SoC 10 may be embedded in a mobile communication device such as a mobile phone, a smart phone, a tablet personal computer (PC), a personal digital assistant (PDA), a MP3 player, a laptop computer, etc. The SoC 10 may also be embedded in an information technology (IT) device or other portable electronic device.

Figure 2:
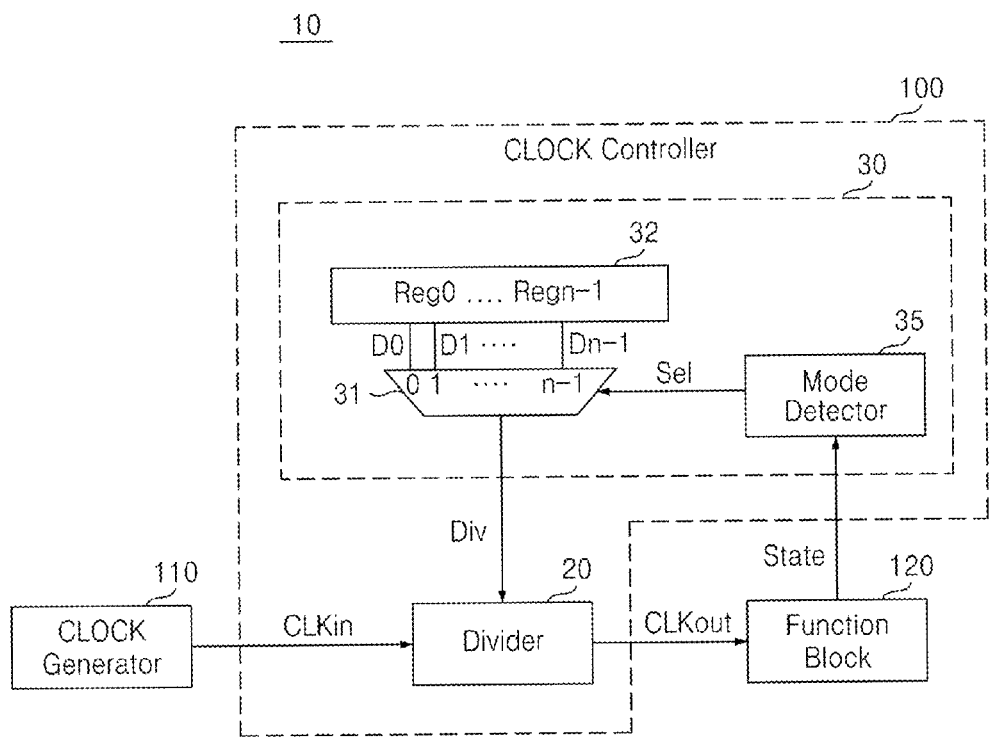
FIG. 2 is a more detailed block diagram of an example embodiment of the SoC illustrated in FIG. 1.

FIG. 2 is a more detailed block diagram of an example embodiment of the SoC 10 illustrated in FIG. 1.

Referring to FIG. 2, the divider controller 30 includes a register block 32, a mode detector 35 and a selector 31. The register block 32 includes a plurality of registers Reg0 through Regn-1, where "n" is a natural number greater than or equal to 3.

For clarity of the description, it is assumed that a frequency increases in order of the first, third and second frequencies, and a division factor decreases in order of first, third and second division factors. As discussed herein, the first division factor may be referred to as the idle mode division factor, the third division factor may be referred to as the wakeup mode division factor, and the second division factor may be referred to as the active mode division factor. In this example, the wakeup mode frequency is greater than the idle mode frequency, and the active mode frequency is greater than the wakeup mode frequency. Moreover, the wakeup mode division factor is less than the idle mode division factor, and the active mode division factor is less than the wakeup mode division factor. However, inventive concepts are not restricted to only the example embodiments discussed herein.

Still referring to FIG. 2, the register block 32 may store a plurality of division factors D0 through Dn-1. When the register block 32 stores "n" division factors, each of the registers Reg0 through Regn-1 may store a single division factor.

The mode detector 35 may be implemented in the form of a finite state machine (FSM), which will be discussed in more detail later. In at least one example embodiment, the mode detector 35 monitors the state of the function block 120 based on the state signal State. Based on the monitored state of the function block 120, the mode detector 35 enters one of a plurality of states (e.g., an idle mode, a wakeup mode and an active mode), and outputs a select signal Sel to the selector 31 based on its mode. The selector 31 outputs a division factor Div from among the division factors D0 through Dn-1 in response to the select signal Sel from the mode detector 35.

For example, when the mode detector 35 determines that the function block 120 is in the idle state, the mode detector 35 transitions to the idle mode (if not already in the idle mode) and outputs a first select signal Sel0. The selector 31 outputs the first (idle mode) division factor D0 received from the register Reg0 in response to the first select signal Sel0.

The divider 20 then sets an operating frequency of the operating clock signal CLKout to the idle mode frequency, which is obtained by dividing the reference frequency by the idle mode division factor D0, and outputs the operating clock signal CLKout having the idle mode frequency to the function block 120.

According to at least some example embodiments, if the function block 120 transitions from the active state to the idle state, then the frequency of the operating clock signal CLKout changes from the active mode frequency to the idle mode frequency in response to the change in the state of the function block 120. As a result, unnecessary consumption of power may be reduced in the SoC 10.

When the function block 120 is in the active state, the mode detector 35 transitions to the active mode (if not already in the active mode) and outputs a second select signal Seln-1. The selector 31 outputs the active mode division factor Dn-1 received from the register Regn-1 in response to the second select signal Seln-1.

The divider 20 then sets the operating frequency of the operating clock signal CLKout to the active mode frequency obtained by dividing the reference frequency by the active mode division factor Dn-1, and outputs the operating clock signal CLKout having the active mode frequency to the function block 120.

When the function block 120 is in the idle state and then transitions from the idle state to the active state, the state signal State transitions (e.g., from logic low to logic high). In response to the transition of the function block 120 from the idle state to the active state, the mode detector 35 transitions to the wakeup mode and outputs at least one third select signal Selk. The selector 31 outputs a wakeup mode division factor Dk from register Regk in response to the third select signal Selk. In this example, k is one of 1, 2, . . . , n-2. Herein, n-2 is sometimes referred to as N. The divider 20 sets the operating frequency of the operating clock CLKout to the wakeup mode frequency, which is obtained by dividing the reference frequency by the wakeup mode division factor Dk. The divider 20 then outputs the operating clock signal CLKout having the wakeup mode frequency to the function block 120. The operating clock signal CLKout maintains the wakeup mode frequency until a given, desired or predetermined count time after the function block 120 transitions from the idle state to the active state. That is, for example, the operating clock signal CLKout maintains the wakeup mode frequency until a given time period expires. In one example, the operating clock signal CLKout maintains the wakeup mode frequency until the mode detector 35 transitions from the wakeup mode to the active mode.

Still referring to FIG. 2, the mode detector 35 may include at least one counter. The counter is configured to count the given, desired or predetermined count time during which the operating frequency of the operating clock CLKout is set to one of the at least one wakeup mode frequencies. While each count time for the respective at least one wakeup modes is being counted, the operating clock signal CLKout is set to one of the at least one wakeup mode frequencies. When the count time elapses, the mode detector 35 transitions to the active mode and the operating frequency is set to the active mode frequency.

If the operating frequency changes (e.g., abruptly changes) from the idle mode frequency to the active mode frequency when the function block 120 transitions from the idle state to the active state, a sudden voltage drop may cause the SoC 10 to malfunction. However, when the function block 120 operates with the wakeup mode frequency for a given, desired or predetermined count time (time period) after the function block 120 transitions from the idle state to the active state, the current applied to the function block 120 gradually increases, and therefore, the function block 120 operates normally without sudden voltage drop.

Figure 3:
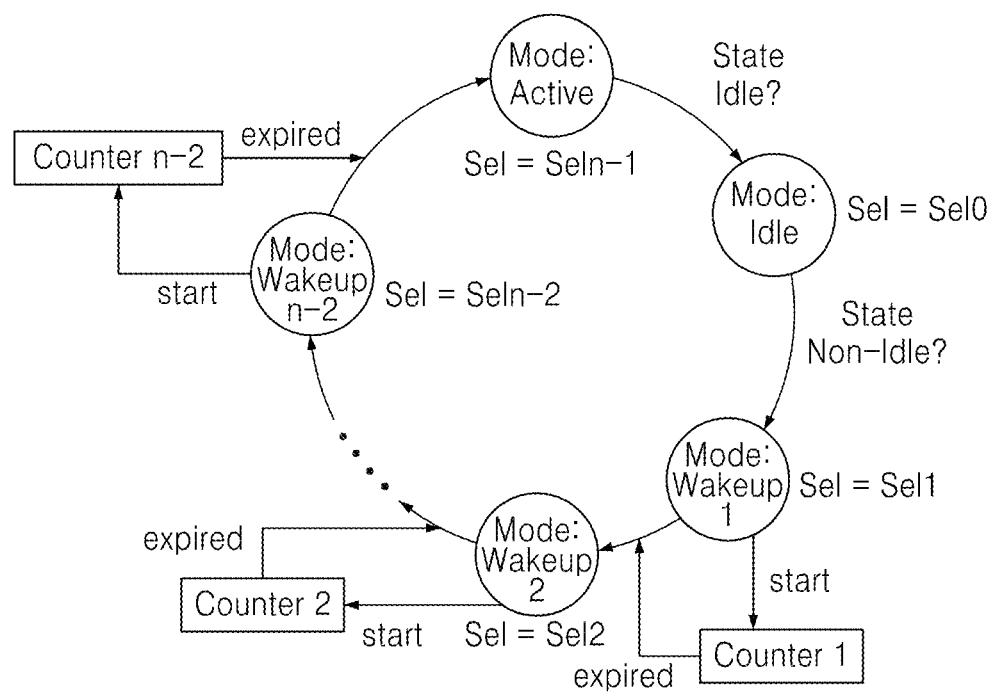
FIG. 3 is a diagram showing an example embodiment of a finite state machine (FSM) implementation of the mode detector 35 shown in FIG. 2.

FIG. 3 is a diagram illustrating an example embodiment of a finite state machine (FSM) implementation of the mode detector 35 illustrated in FIG. 2. In the example shown in FIG. 3, the mode detector 35 outputs the select signal Sel to select the division factor Div according to the monitored state of the function block 120.

As is known, a FSM is a machine capable of having one of a finite number of states. The machine is in only one state at a time, and the state that the machine is in at any given time is called the current state. The FSM may change from one state to another when initiated by a triggering event or condition. The changing from one state to another is referred to as a transition. A particular FSM is defined by a list of the possible transition states from each current state, and the triggering condition for each transition. Because FSMs are generally well-known, example embodiments of FSMs will be understood by those of ordinary skill in the art that various changes in forms and details may be made therein without departing from the spirit and scope of inventive concepts.

Referring to FIG. 3, the FSM includes a plurality of (e.g., n) modes (e.g., limited modes) of the function block 120 as its states. The modes are linked to each other by certain conditions. The FSM may be implemented in hardware, software or a combination thereof.

In one example, if the initial state of the function block 120 is the active mode, then the mode detector 35 outputs an active mode select signal Seln-1 to select the active mode division factor Dn-1. In response to the active mode select signal Seln-1, the selector 31 selects the register Regn-1, and outputs the active mode division factor Dn-1 to the divider 20.

When the state of the function block 120 transitions from the active state to the idle state, the mode detector 35 detects that the function block 120 is in the idle state and transitions from the active mode to the idle mode. In the idle mode, the mode detector 35, outputs an idle mode select signal Sel0 to select the idle mode division factor D0. The selector 31 selects the register Reg0 in response to the idle mode select signal Sel0 and outputs the idle mode division factor D0 to the divider 20.

When the function block 120 transitions from the idle state to the active state, the mode detector 35 detects the transition and enters the wakeup mode for a given, desired or predetermined period of time. While in the wakeup mode, the mode detector 35 outputs at least one wakeup mode select signal Selk. The selector 31 selects the register Regk in response to the wakeup mode select signal Selk, and outputs the wakeup mode division factor Dk to the divider 20. In this example, the at least one wakeup mode select signal Selk is one of select signals Sel1 through Seln-2. In this example, n is an integer indicative of the number of division factors and modes of the FSM shown in FIG. 3, and n-2 is indicative of the number of stages in the wakeup mode.

Still referring to FIG. 3, the mode detector 35 may have one or more stages Wakeup1 through Wakeupn-2 in the wakeup mode. The wakeup mode stages may be set in a given, desired or predetermined order, and the order may be changed according to a users' setting or design process requirements. The order may be transient from the idle mode frequency to the active mode frequency. Count times Counter1 through Countern-2 are set for the respective wakeup mode stages Wakeup1 through Wakeupn-2.

The mode detector 35 allows each of the at least one wakeup mode frequencies to be applied as the operating frequency only for a given, desired or predetermined count time set for each wakeup mode frequency. When all of the count times expire, the mode detector 35 enters the active mode and outputs the active mode select signal Seln-1.

Figure 4:
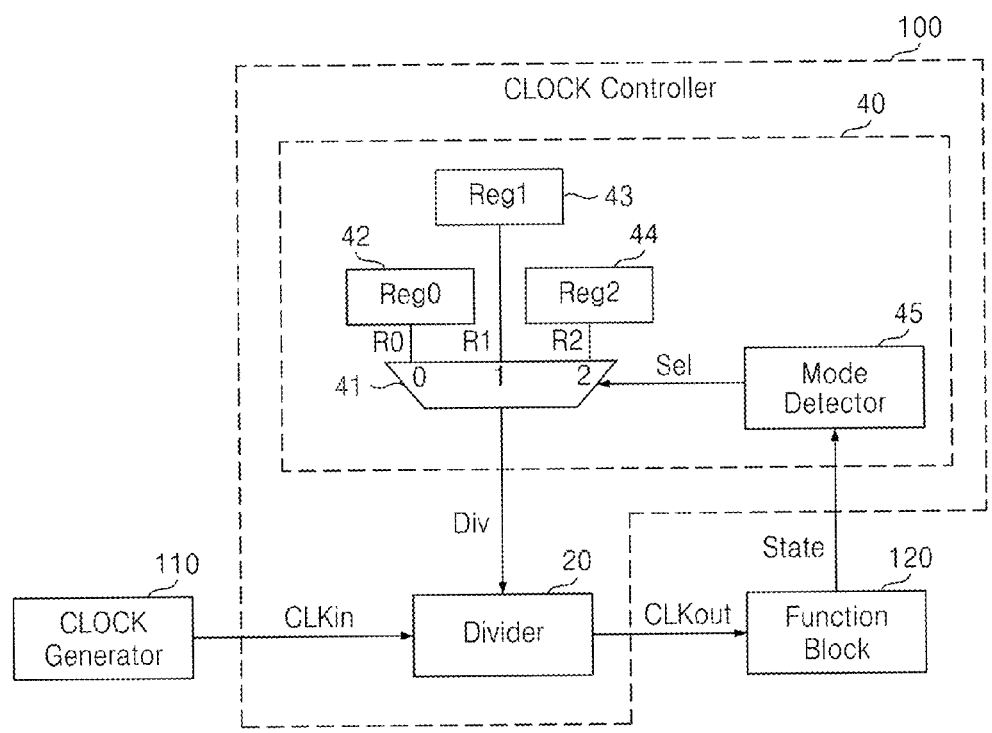
FIG. 4 is a more detailed block diagram of an example embodiment of the SoC illustrated in FIG. 1.
Figure 5:
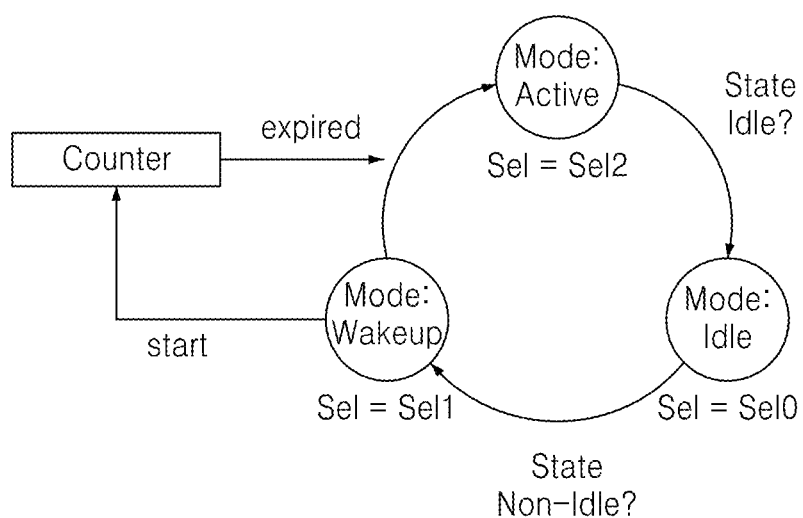
FIG. 5 is a diagram showing an example embodiment of a finite state machine (FSM) implementation of the mode detector 45 illustrated in FIG. 4.

FIG. 4 is a detailed block diagram of the SoC 10 illustrated in FIG. 1 according to another example embodiment of inventive concepts. FIG. 5 is a diagram illustrating an example embodiment of a finite state machine (FSM) implementation of the mode detector 45 illustrated in FIG. 4.

In the example shown in FIGS. 4 and 5, it is assumed that there are a total of three different division factors (n=3) by which the reference frequency of the reference clock signal CLKin may be divided. The three different division factors include: an idle mode division factor R0; a wakeup mode division factor R1; and an active mode division factor R2.

When the initial state of the function block 120 is the active state, the mode detector 45 outputs an active mode select signal Sel2 to select the active mode division factor R2. In response to the active mode select signal Sel2, a selector 41 selects a register Reg2, and outputs the active mode division factor R2 to the divider 20.

When the mode detector 45 determines that the function block 120 is in the idle state, the mode detector 45 outputs an idle mode select signal Sel0 to select the idle mode division factor R0. In response to the idle mode select signal Sel0, the selector 41 selects a register Reg0, and outputs the idle mode division factor R0 to the divider 20.

When the function block 120 transitions from the idle state to the active state, the mode detector 45 transitions to the wakeup mode, and outputs a wakeup mode select signal Sel1 to select the wakeup mode division factor R1. The selector 41 selects a register Reg1 in response to the wakeup mode select signal Sel1, and outputs the wakeup mode division factor R1 to the divider 20. In one example, the idle mode frequency may be about half of the wakeup mode frequency.

Figure 6:
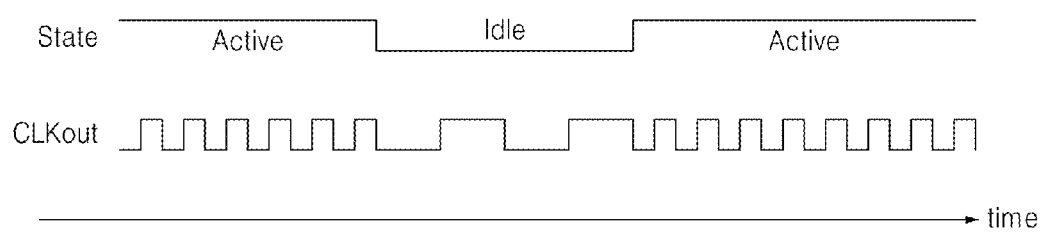
FIG. 6 is a timing chart of signals of a SoC according to example embodiments of inventive concepts.

FIG. 6 is a timing chart of signals of the SoC 10 according to an example embodiment of inventive concepts.

Referring to FIG. 6, the operating frequency of the operating clock signal CLKout when the function block 120 is in the active state is greater than the operating frequency of the operating clock signal CLKout when the function block 120 is in the idle state.

Referring to FIGS. 4 and 6, the clock controller 100 monitors a state signal State output from the function block 120. In one example, the clock controller 100 determines that the function block 120 is in the active state when the state signal State is high, but determines that the function block 120 is in the idle state when the state signal State is low. However, example embodiments are not limited to this example.

According to at least one example embodiment, when the function block 120 is in the active state, the clock controller 100 sets the operating frequency to the active mode frequency, and applies the operating clock signal CLKout having the active mode frequency to the function block 120. When the function block 120 transitions from the active state to the idle state, the clock controller 100 sets the operating frequency to the idle mode frequency and applies the operating clock signal CLKout having the idle mode frequency to the function block 120. When the function block 120 transitions from the idle state to the active state, the clock controller 100 sets the operating frequency to the active mode frequency and applies the operating clock signal CLKout having the active mode frequency to the function block 120. Consequently, unnecessary consumption of power may be reduced because the function block 120 operates with the idle mode frequency, rather than the active mode frequency, in the idle state. In addition, when the operating clock signal CLKout of the function block 120 cannot be gated, the idle mode frequency is continuously applied as the operating frequency, so that the function block 120 maintains functionality.

Figure 7:
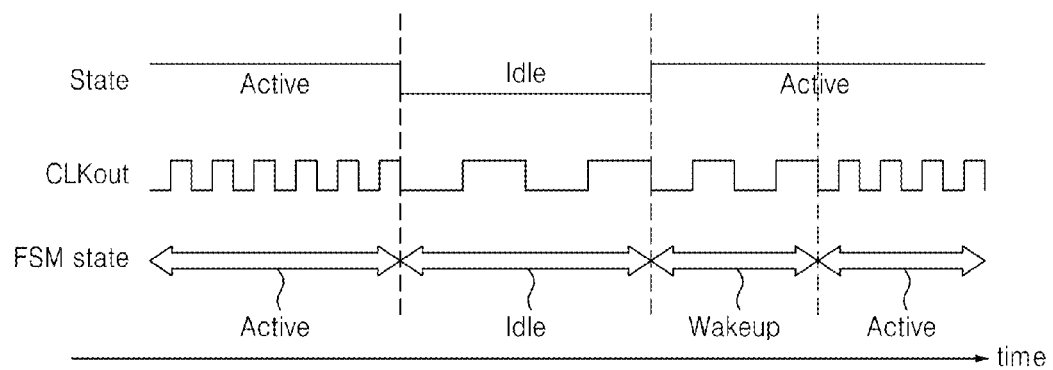
FIG. 7 is a timing chart of signals of a SoC according to another example embodiments of inventive concepts.

FIG. 7 is a timing chart of signals of the SoC 10 according to another example embodiment of inventive concepts.

With regard to FIG. 7, the operations of the clock controller 100 are similar or substantially similar to those in the example embodiment illustrated in FIG. 6. For the sake of brevity, only differences between the example embodiments illustrated in FIGS. 6 and 7 will be described.

Referring to FIG. 7, when the function block 120 transitions from the idle state to the active state, the clock controller 100 sets the operating frequency of the function block 120 to a wakeup mode frequency for a given period, rather than to the active mode frequency as in FIG. 6. As shown in FIG. 7, the wakeup mode frequency is greater than the operating frequency of the operating clock signal CLKout during the idle state, but less than the operating frequency of the operating clock signal CLKout in the active state. That is, the wakeup mode frequency is greater than the idle mode frequency, but less than the active mode frequency.

The operating clock signal CLKout having the wakeup mode frequency is applied to the function block 120 for a given, desired or predetermined count time from the moment when the function block 120 transitions from the idle state to the active state. In one example, the wakeup mode frequency may be about half of the active mode frequency, but example embodiments are not restricted to this example. In at least some other example embodiments, the division factor Div corresponding to a medium or intermediate frequency may be selected from among a group of registers to set the operating frequency.

When the operating clock signal CLKout with the active mode frequency is abruptly applied to the function block 120 in the idle state, a voltage drop may occur due to the surge of current supplied to the function block 120. To suppress such a voltage drop, the wakeup mode frequency, which is between the idle mode frequency and the active mode frequency, is applied to the function block 120 for a given, desired or predetermined count time (e.g., during the wakeup period or mode). As a result, the function block 120 operates normally without a voltage drop caused by the sudden change from the idle mode frequency to the active mode frequency, and malfunction of the function block 120 may be suppressed and/or prevented.

Figure 8:
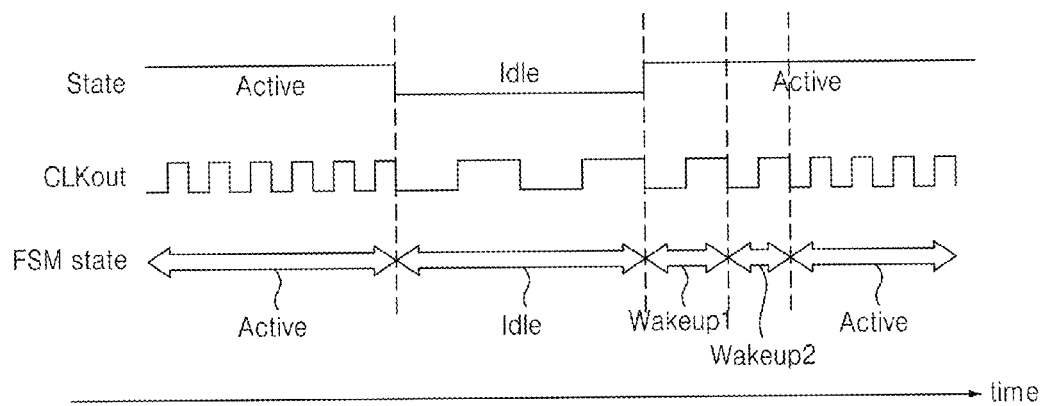
FIG. 8 is a timing chart of signals of a SoC according to yet another example embodiments of inventive concepts.

FIG. 8 is a timing chart of signals of the SoC 10 according to another example embodiment of inventive concepts.

With regard to FIG. 8, the operations of the clock controller 100 are similar or substantially similar to those in the example embodiment illustrated in FIG. 7. For the sake of brevity, only differences between the example embodiments illustrated in FIGS. 7 and 8 will be described.

In the example shown in FIG. 8, the wakeup mode of the mode detector 35 includes a plurality of stages (e.g., at least two wakeup mode stages), rather than only a single wakeup mode state as in FIG. 7. For the sake of this description, FIG. 8 shows that the wakeup mode has two stages, and that the wakeup mode frequency includes at least two wakeup mode frequencies (stages).

For a given, desired or predetermined first count time Wakeup1 after the function block 120 transitions from the idle state to the active state, the clock controller 100 sets the frequency of the operating clock signal CLKout to a first wakeup mode frequency.

After expiration of the first count time Wakeup1, the clock controller 100 sets the frequency of the operating clock signal CLKout to a second wakeup mode frequency for a given, desired or predetermined second count time Wakeup2. In this example, the first wakeup mode frequency and the second wakeup mode frequency are frequencies between the idle mode frequency and the active mode frequency, and the first wakeup mode frequency is less than the second wakeup mode frequency. At least two different wakeup mode frequencies may be set by the mode detector for respective count times.

With regard to at least some example embodiments, only two wakeup mode stages and frequencies have been described. However, example embodiments are not restricted to only these examples. In other example embodiments, more than two wakeup mode stages and frequencies may be implemented.

Figure 9:
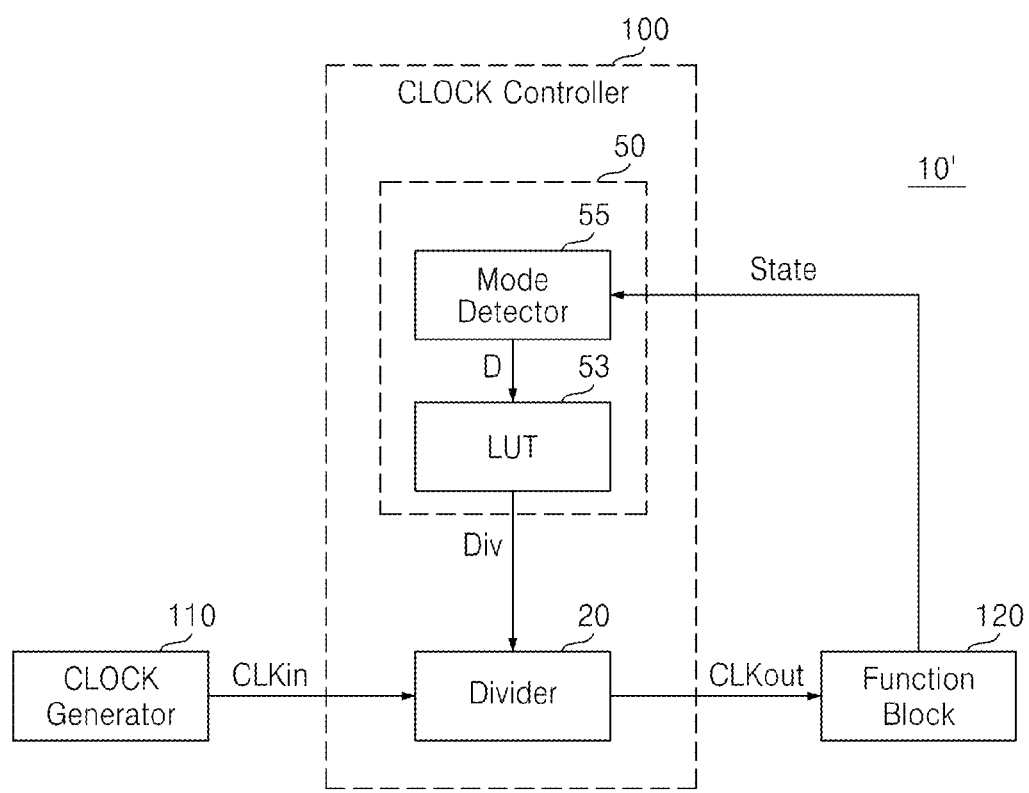
FIG. 9 is a block diagram of a SoC according to another example embodiment of inventive concepts.

FIG. 9 is a block diagram of a SoC 10' according to another example embodiment of inventive concepts. The SoC 10' is similar to the SoC 10. Thus, for the sake of brevity, only differences between the example embodiments illustrated in FIGS. 2 and 9 will be explained in detail.

Referring to FIG. 9, the clock controller 100 includes a divider controller 50 and the divider 20. The divider controller 50 includes a mode detector 55 and a look-up table (LUT) 53.

As with the mode detector 35, the mode detector 55 may also be implemented in the form of a finite state machine (FSM). In at least one example embodiment, the mode detector 55 monitors the state of the function block 120. Based on the monitored state of the function block 120, the mode detector 55 enters one of a plurality of states (e.g., an idle mode, at least one wakeup mode and an active mode). The mode detector 55 outputs a select signal D based on the entered state.

In this example, the operation of the mode detector 55 is the same or substantially the same as that of the mode detector 35 illustrated in FIG. 2. Thus, further discussion of the mode detector 55 is omitted.

Still referring to FIG. 9, the LUT 53 stores a plurality of division factors. In example operation, the LUT 53 outputs one of the division factors in response to the select signal D from the mode detector 55. In more detail, the LUT 53 may output an idle mode division factor when the select signal D indicates the idle state, an active mode division factor when the select signal D indicates the active state, and at least one wakeup mode division factor when the select signal D indicates the wakeup state. In this example, the idle mode division factor, the active mode division factor and the at least one wakeup mode division factor may be different numbers, which are not 0. The idle mode division factor may be greater than the wakeup mode division factor, and the wakeup mode division factor may be greater than the active mode division factor.

Figure 10:
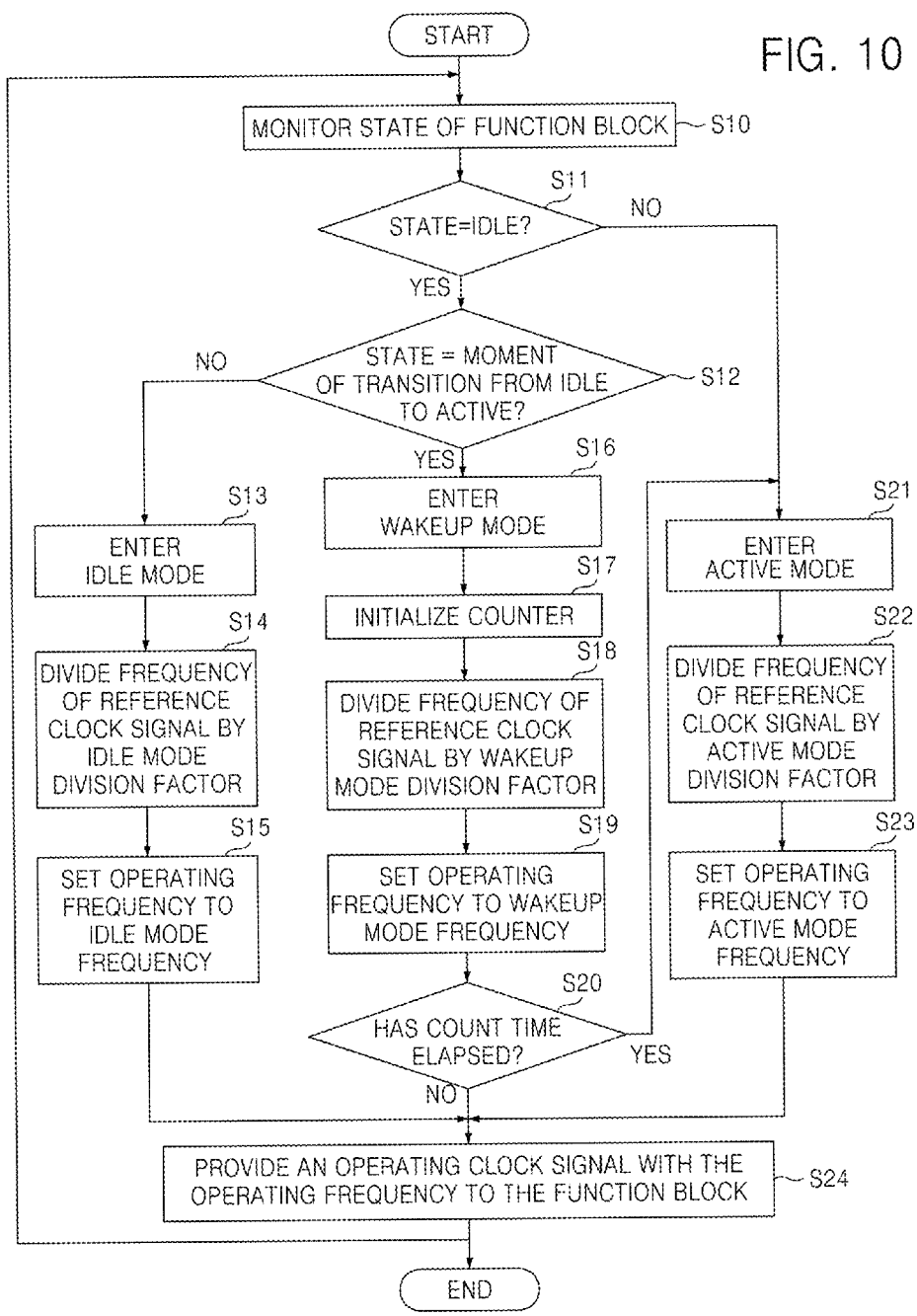
FIG. 10 is a flowchart illustrating a method of controlling a clock signal according to an example embodiment of inventive concepts.

FIG. 10 is a flowchart illustrating a method of controlling a clock signal according to an example embodiment of inventive concepts. For the sake of clarity, the method shown in FIG. 10 will be described with regard to the example embodiment shown in FIG. 2. However, the example embodiment shown in FIG. 10 is not limited to this implementation and/or example.

Referring to FIG. 10, at operation S10 the mode detector 35 monitors the state of the function block 120.

At operation S11 the mode detector 35 determines whether the function block 120 is in the idle state. If the function block 120 is in the idle state, then the mode detector 35 determines whether the function block 120 is at the moment or instant of transition from the idle state to the active state at operation S12. If the function block 120 is not at the moment of transition (e.g., transition time) from the idle state to the active state in operation S12, then the mode detector 35 enters the idle mode in operation S13 and outputs the selection signal Sel indicating the idle mode.

At operation S14, the clock controller 100 divides a frequency of the reference clock signal CLKin by the idle mode division factor. In this example, the idle mode division factor is a division factor corresponding to the idle mode.

In operation S15, the clock controller 100 sets the operating frequency of the function block 120 to the idle mode frequency obtained by dividing the reference clock frequency by the idle mode division factor. The clock controller 100 then provides an operating clock signal CLKout having the idle mode frequency to the function block 120 in operation S24. The process then returns to operation S10 in which the mode detector 35 monitors the state of the function block 120.

Returning to operation S12, if the mode detector 35 determines that the function block 120 is at the moment of transition from the idle state to the active state, then the mode detector 35 transitions to the wakeup mode in operation S16 and outputs a selection signal Sel indicating the wakeup mode.

At operation S17, the clock controller 100 initializes a counter (e.g., the counter discussed above with regard to FIG. 3). At operation S18, the clock controller 100 divides the frequency of the reference clock signal CLKin by the wakeup mode division factor. In operation S19, the clock controller 100 sets the operating frequency to the wakeup mode frequency obtained by dividing the reference clock frequency by the wakeup mode division factor.

At operation S20 the clock controller 100 then checks whether a count time of the initialized counter (operation S17) has elapsed. If the count time has not elapsed, then the clock controller 100 provides the operating clock signal having the wakeup mode frequency to the function block 120 in operation S24.

The clock controller 100 provides the operating clock signal CLKout having the wakeup mode frequency in operation S24 until a given, desired or predetermined count time elapses in operation S20.

Returning to operation S20, if and when the count time has elapsed or expired the mode detector 35 enters the active mode at operation S21.

The clock controller 100 then divides the frequency of the reference clock signal by the active mode division factor in operation S22.

In operation S23, the clock controller 100 sets the operating frequency to the active mode frequency obtained by dividing the frequency of the reference clock signal by the active mode division factor.

The clock controller 100 then provides the operating clock signal having the active mode frequency to the function block 120 in operation S24.

Returning to operation S11, if the function block 120 is not in the idle state, then the process proceeds to operation S21 and continues as discussed above.

In at least the example embodiment shown in FIG. 10, the mode detector 35 continuously monitors the state of the function block 120 even when the function block 120 operates according to an operating clock signal having a different frequency so that an operating clock signal is provided to the function block 120 according to the current state of the function block 120 and/or transition of the state of the function block 120.

Figure 11:
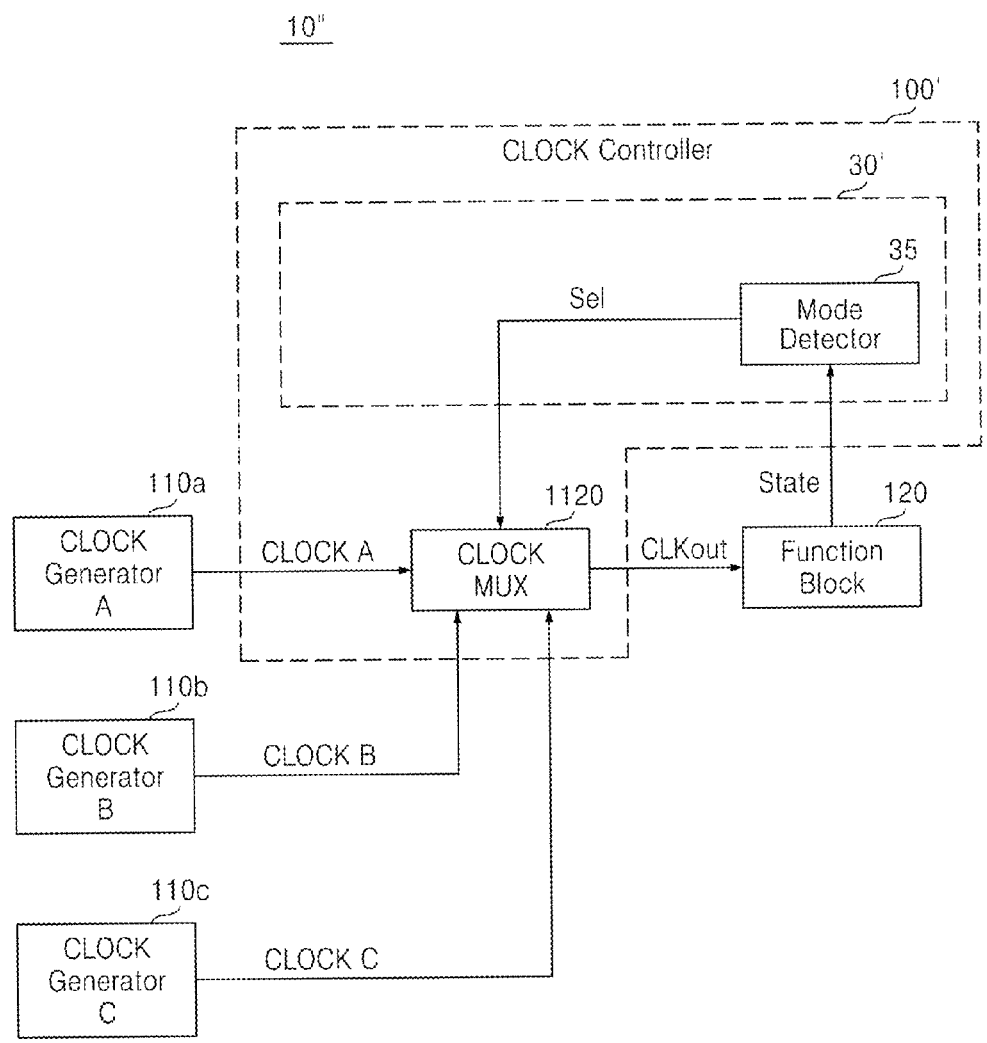
FIG. 11 is a block diagram illustrating another example embodiment of the SoC shown in FIG. 1.

FIG. 11 is a block diagram illustrating another example embodiment of a SoC.

Referring to FIG. 11, the SoC 10" includes a clock controller 100'. The clock controller 100' includes a divider controller 30' and a clock signal multiplexer 1120. The divider controller 30' includes a mode detector 35. The SoC 10" further includes at least one function block 120 and a plurality of clock generators 110a, 110b and 110c. The mode detector 35 is the same or substantially the same as the mode detector 35 shown in FIG. 2. Thus, a detailed discussion will be omitted for the sake of brevity.

As with the clock controller 100 shown in FIG. 2, the clock controller 100' monitors the state of the function block 120 and sets and operating frequency of the operating clock signal CLKout according to the monitored state of the function block 120. The clock controller 100' outputs the operating clock signal CLKout to the function block 120.

As mentioned above, the clock controller 100' includes a divider controller 30' and a clock signal multiplexer 1120.

The divider controller 30' monitors the state of the function block 120, and outputs a select signal Sel based on the monitored state of the function block 120. The clock signal multiplexer 1120 selects one of a plurality of clock signals CLOCK A, CLOCK B and CLOCK C to output as the operating clock signal CLKout based on the select signal Sel from the mode detector 35.

The divider controller 30' monitors the state of the function block 120 based on the state signal State output from the function block 120.

In one example, when the state signal State output from the function block 120 is high (e.g., a logic high or '1'), the divider controller 30' determines that the function block 120 is in the active state. On the other hand, when the state signal output from the function block 120 is low (e.g., a logic low or '0'), the divider controller 30' determines that the function block 120 is in the idle state.

As mentioned above, the SoC 10" shown in FIG. 11 includes a plurality of clock signal generators 110a through 110c. Each of the clock signal generators 110a through 110c generates a respective one of the plurality of clock signals CLOCK A, CLOCK B and CLOCK C. In at least this example embodiment, each of the plurality of clock signals CLOCK A, CLOCK B and CLOCK C has a frequency corresponding to one of the idle mode frequency, the active mode frequency and the wakeup mode frequency. The idle mode frequency, the active mode frequency and the wakeup mode frequency are the same as those discussed above.

Figure 12:
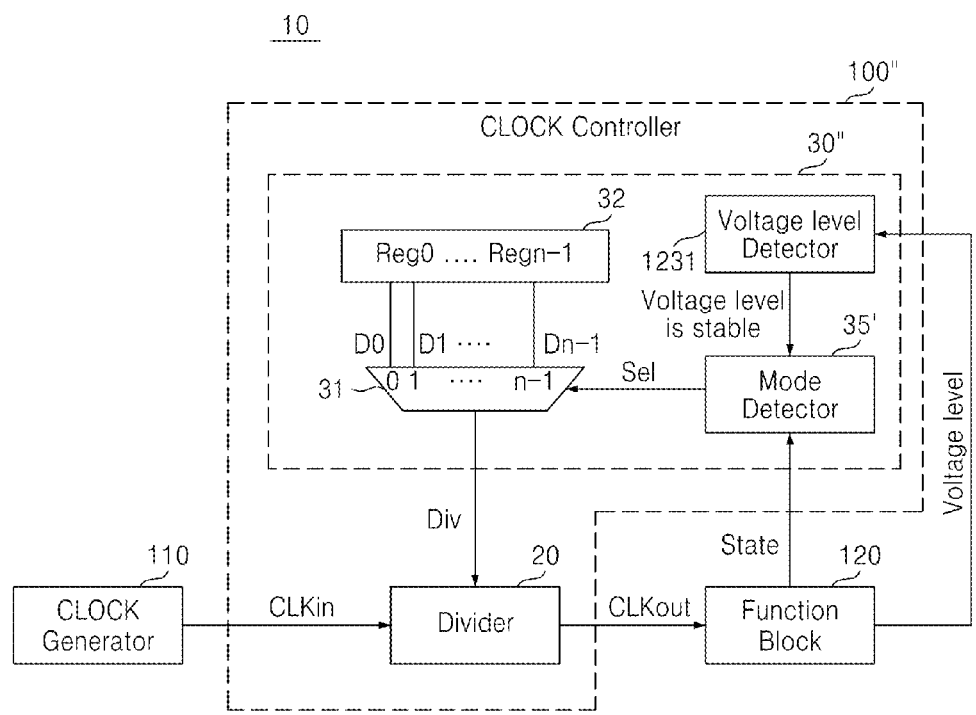
FIG. 12 is a block diagram illustrating yet another example embodiment of the SoC shown in FIG. 1.

FIG. 12 is a block diagram illustrating yet another example embodiment of the SoC 10 shown in FIG. 1. The example shown in FIG. 12 is similar to the example shown in FIG. 2, but further includes a voltage detector 31.

Referring to FIG. 12, the divider controller 30" includes a register block 32, a mode detector 35' and a selector 31. The register block 32 and the selector 31 are the same or substantially the same as those shown in FIG. 2. Thus, a detailed description of these elements will be omitted for the sake of brevity.

The mode detector 35' monitors the state of the function block 120 in the same or substantially the same manner as the mode detector 35 in FIG. 2, and outputs a select signal Sel according to the monitored state of the function block 120. The selector 31 outputs a division factor Div from among the division factors D0 through Dn-1 in response to the select signal Sel.

For example, when the mode detector 35' determines that the function block 120 is in the idle state, the mode detector 35' outputs the idle mode select signal Sel0. The selector 31 outputs the idle mode division factor D0 received from the register Reg0 in response to the idle mode select signal Sel0 from the mode detector 35'.

The divider 20 then sets an operating frequency of the operating clock signal CLKout to the idle mode frequency, which is obtained by dividing the reference frequency by the idle mode division factor D0, and outputs the operating clock signal CLKout having the idle mode frequency to the function block 120.

According to at least some example embodiments, when the function block 120 transitions from the active state to the idle state, the frequency of the operating clock signal CLKout changes from the active mode frequency to the idle mode frequency in response to the change in the state of the function block 120. As a result, unnecessary consumption of power may be reduced in the SoC 10.

When the mode detector 35' determines that the function block 120 is in the active state, the mode detector 35' outputs the active mode select signal Seln-1. The selector 31 outputs the active mode division factor Dn-1 received from the register Regn-1 in response to the active mode select signal Seln-1.

The divider 20 then sets the operating frequency of the operating clock signal CLKout to the active mode frequency obtained by dividing the reference frequency by the active mode division factor Dn-1, and outputs the operating clock signal CLKout having the active mode frequency.

When the function block 120 transitions from the idle state to the active state, the mode detector 35' enters the wakeup mode, and outputs at least one wakeup mode select signal Selk. The selector 31 outputs a wakeup mode division factor Dk received from the register Regk in response to the wakeup mode select signal Selk. The divider 20 sets the operating frequency of the operating clock CLKout to the wakeup mode frequency obtained by dividing the reference frequency by the wakeup mode division factor Dk. The divider 20 then outputs the operating clock signal CLKout having the wakeup mode frequency.

Still referring to FIG. 12, the divider controller 30" further includes a voltage level detector 1231. The voltage level detector 1231 monitors the voltage level of the function block 120, and outputs a voltage level stability signal when the voltage level of the function block 120 stabilizes after the operating frequency of the operating clock CLKout is set to one of the at least one wakeup mode frequencies. In response to the voltage level stability signal indicating that the voltage level of the function block has stabilized, the mode detector 35' transitions to the active mode (or alternatively to the next wakeup mode stage) and outputs the active mode select signal Sn-1 to set the operating frequency to the active mode frequency (or another of the wakeup mode frequencies).

Figure 13:
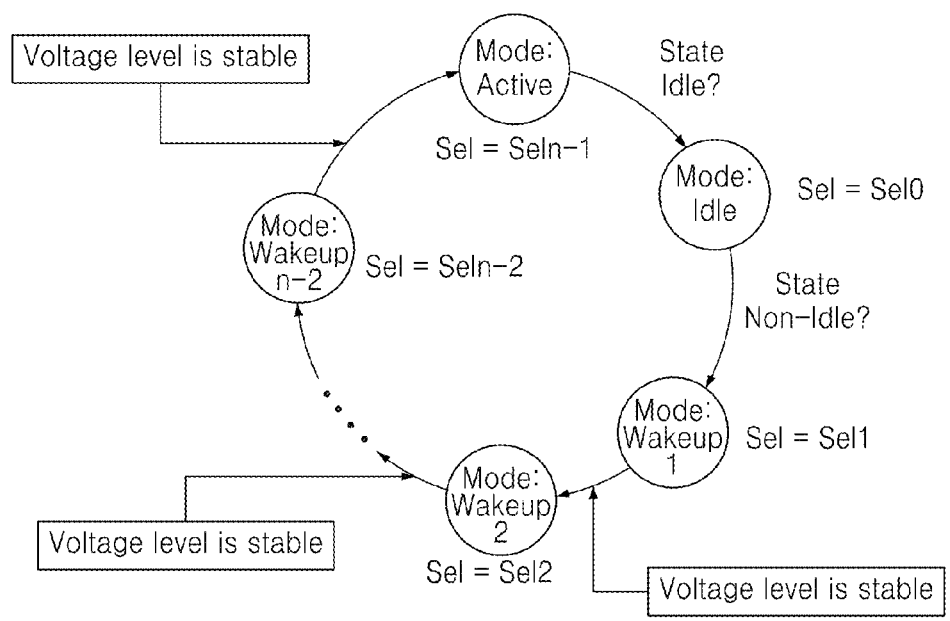
FIG. 13 is a diagram showing an example embodiment of a finite state machine (FSM) implementation of the mode detector illustrated in FIG. 12.

FIG. 13 is a diagram illustrating an example embodiment of a finite state machine (FSM) implementation of the mode detector 35' illustrated in FIG. 12. In the example shown in FIG. 13, the mode detector 35' outputs the select signal Sel to select the division factor Div according to the current state of the function block 120.

As with the example embodiment shown in FIG. 3, the FSM shown in FIG. 13 includes a plurality of (e.g., n-2) modes (e.g., limited modes) of the function block 120 as its states. The modes are linked to each other by certain conditions. The FSM may be implemented in hardware, software or a combination thereof.

In one example, if the initial state of the function block 120 is the active state, then the mode detector 35' outputs the active mode select signal Seln-1 to select the active mode division factor Dn-1. In response to the active mode select signal Seln-1, the selector 31 selects the register Regn-1, and outputs the active mode division factor Dn-1 to the divider 20.

When the state of the function block 120 transitions from the active state to the idle state, the mode detector 35' detects that the function block 120 is in the idle state, and outputs the idle mode select signal Sel0 to select the idle mode division factor D0. The selector 31 selects the register Reg0 in response to the idle mode select signal Sel0 and outputs the idle mode division factor D0 to the divider 20.

When the function block 120 transitions from the idle state to the active state, the mode detector 35' detects this transition and enters the wakeup mode. While in the wakeup mode, the mode detector 35' outputs at least one wakeup mode select signal Selk. The selector 31 selects the register Regk in response to the wakeup mode select signal Selk, and outputs the wakeup mode division factor Dk to the divider 20. In this example, the at least one wakeup mode select signal Selk is one of wakeup mode select signals Sel1 through Seln-2, where n is an integer indicative of the number of division factors, and n-2 is indicative of the number of stages in the wakeup mode.

Still referring to FIG. 13, the wakeup mode may have one or more stages Wakeup1 through Wakeupn-2. The wakeup mode stages may be set in a given, desired or predetermined order. The order may be changed according to a users' setting or design process requirements. The order may be transient from the idle mode frequency to the active mode frequency.

In this example embodiment, transitions between wakeup mode stages by the mode detector 35' are triggered by the voltage level detector 1231 shown in FIG. 12. The mode detector 35' applies the wakeup mode frequency (e.g., corresponding to a given stage of the wakeup mode) as the operating frequency until the voltage level of the function block 120 stabilizes. That is, for example, the mode detector 35' allows the frequency corresponding to each wakeup mode stage to be applied as the operating frequency until the state of the SoC 10 changes (e.g., stabilizes). When the voltage level of the function block 120 stabilizes after the mode detector 35' transitions to the final wakeup mode stage, the mode detector 35' enters the active mode. The mode detector 35' then outputs the active mode select signal Seln-1.

Figure 14:
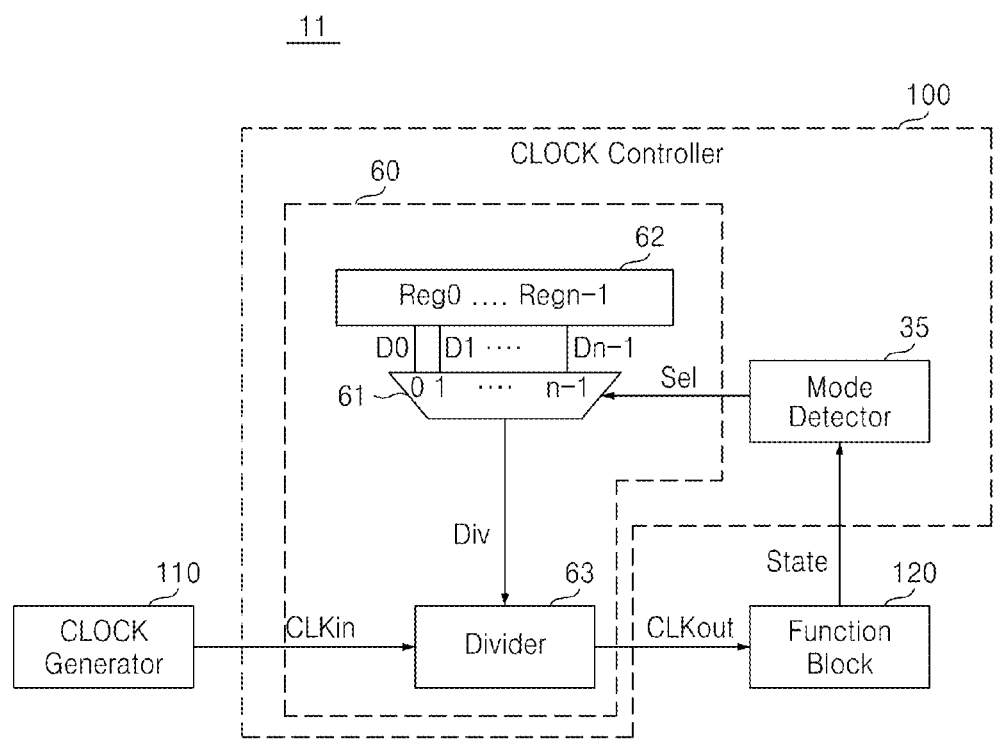
FIG. 14 is a block diagram illustrating other example embodiment of the SoC shown in FIG. 1.

FIG. 14 is a block diagram illustrating another example embodiment of the SoC shown in FIG. 1. The example shown in FIG. 14 is similar to the example shown in FIG. 2, but the clock controller 100 includes an operating frequency setting circuit 60.

Referring to FIG. 14, the clock controller 100 includes a mode detector circuit 35 and an operating frequency setting circuit 60. The mode detector circuit 35 detects a change in an operating state of a function block 120 and generates a select signal based on the detected change in the operating state. The operating frequency setting circuit 60 sets an operating frequency of the function block based on the select signal from the mode detector circuit.

The operating frequency setting circuit 60 decreases the operating frequency of the function block 120 if the select signal Sel is indicative of a change from an active operating state to an inactive operating state, the decreased operating frequency being greater than zero. The operating frequency setting circuit 60 increases the operating frequency of the function block 120 if the select signal Sel is indicative of a change from the inactive operating state to the active operating state.

In other example, if the select signal Sel is indicative of the change from the inactive operating state to the active operating state, the operating frequency setting circuit 60 increases the operating frequency of the function block 120 from a first frequency to a second frequency, and increases the operating frequency from the second frequency to a third frequency after expiration of a first time period after the change in the operating state of the function block 120 from the inactive operating state to the active operating state. The operating frequency setting circuit 60 increases the operating frequency from the third frequency to a fourth frequency after expiration of a second time period after the change in the operating state of the function block 120 from the inactive operating state to the active operating state.

The operating frequency setting circuit 60 comprises a divider circuit 63, a selection circuit 61 and a register block 62. The divider circuit 63, the selection circuit 61 and the register block 62 are the same or substantially the same as those shown in FIG. 2. Thus, a detailed description of these elements will be omitted for the sake of brevity.

Figure 15:
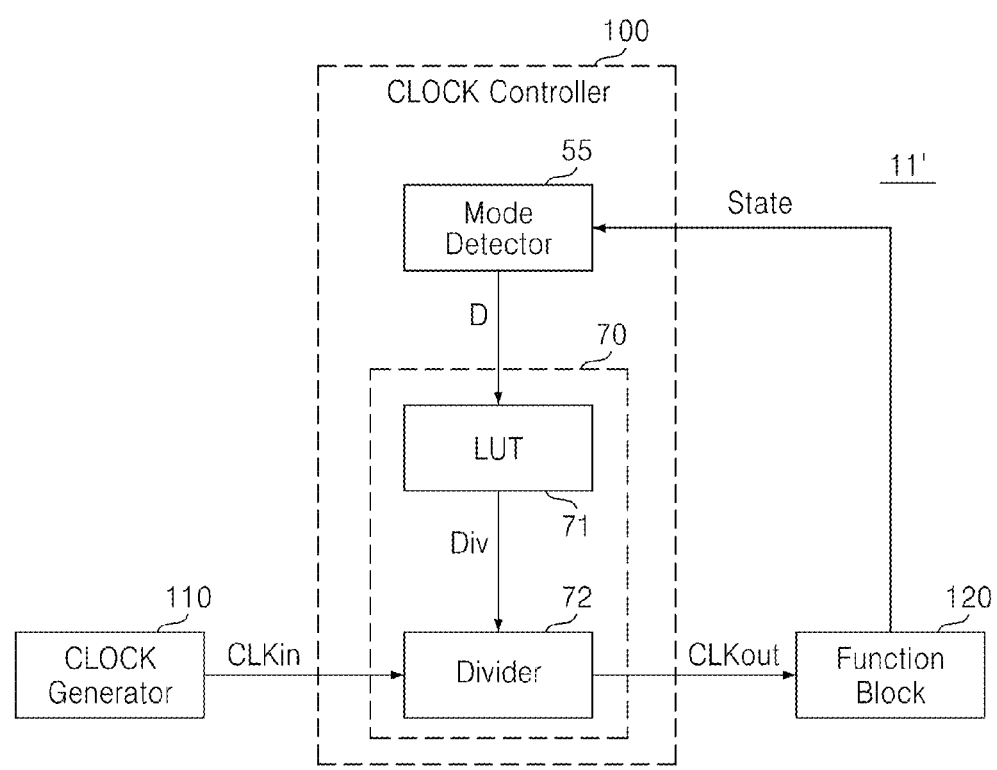
FIG. 15 is a block diagram illustrating yet other example embodiment of the SoC shown in FIG. 1.

FIG. 15 is a block diagram illustrating yet another example embodiment of the SoC shown in FIG. 1. The example shown in FIG. 15 is similar to the example shown in FIG. 14, but the operating frequency setting circuit 60 includes a look-up table 71.

Referring to FIG. 15, the look-up table 71 stores a plurality of division factors and outputs a selected one of the plurality of division factors Div in response to the select signal D from a mode detector circuit 55. The mode detector circuit 55 and the divider circuit 72 are the same or substantially the same as those shown in FIG. 2. Thus, a detailed description of these elements will be omitted for the sake of brevity.

Figure 16:
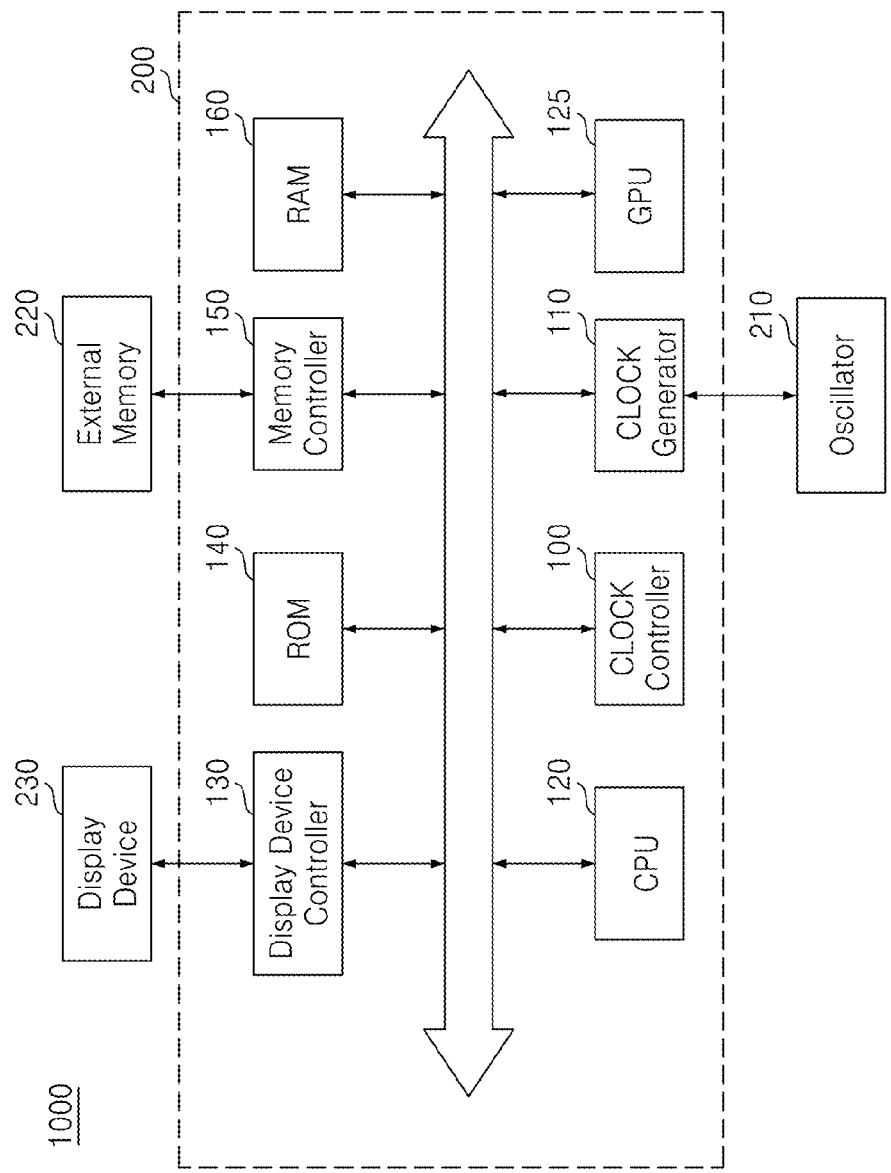
FIG. 16 is a block diagram of a semiconductor system including a SoC according to an example embodiment of inventive concepts.

FIG. 16 is a block diagram of a semiconductor system 1000 including a SoC 200 according to an example embodiment of inventive concepts.

Referring to FIG. 16, the semiconductor system 1000 may be implemented as a handheld device such as a cellular telephone, a smart phone, a tablet computer, a personal digital assistant (PDA), an enterprise digital assistant (EDA), a digital still camera, a digital video camera, a portable multimedia player (PMP), a personal navigation device or portable navigation device (PND), a handheld game console, an e-book, or the like.

The semiconductor system 1000 includes the SoC 200, an oscillator 210, an external memory 220 and a display device 230. The SoC 200 may be an application processor and corresponds to a SoC according to an example embodiment as described herein. The application processor may control the overall operation of the semiconductor system 1000.

The SoC 200 may include the clock controller 100, the clock generator 110, a central processing unit (CPU) 120, a graphics processing unit (GPU) 125, a liquid crystal display (LCD) controller 130, read only memory (ROM) 140, random access memory (RAM) 160, a memory controller 150 and a bus. The SoC 200 may also include other elements, such as a power management unit, a television (TV) processor, etc.

A function block may refer to the CPU 120, the GPU 125, the memory controller 150 or a peripheral circuit control unit (not shown).

The CPU 120 may process or execute programs and/or data stored in the memory 150 or 220. For instance, the CPU 120 may process or execute the programs and/or the data in response to an operating clock signal output from the clock controller 100.

The CPU 120 may be implemented by a multi-core processor. A multi-core processor is a single computing component with two or more independent actual processors (referred to as cores). Each of the processors may read and execute program instructions. The multi-core processor may drive a plurality of accelerators at a time, and therefore, a data processing system including the multi-core processor may perform multi-acceleration.

The GPU 125 may reduce the load of the CPU 120 by reading and executing program instructions related to graphics processing. The GPU 125 receives data from the memory 220 through a memory interface (not shown) and transmits processed data to the memory 220 through the memory interface. The GPU 125 may process or execute the programs and/or the data in response to the operating clock signal output from the clock controller 100.

The programs and/or the data stored in the memory 220 may be loaded to the CPU 120 or the GPU 125 when necessary.

The ROM 140 may store permanent programs and/or data. The ROM 140 may be implemented as erasable programmable ROM (EPROM) or electrically erasable programmable ROM (EEPROM).

The RAM 160 may temporarily store programs, data and/or instructions. The programs and/or data stored in the memory 220 may be temporarily stored in the RAM 160 according to the control of the CPU 120 or a booting code stored in the ROM 140. The RAM 160 may be implemented by dynamic RAM (DRAM) and/or static RAM (SRAM).

The memory controller 150 interfaces with the external memory 220. The memory controller 150 controls the overall operation of the external memory 220 and controls the data communication between a host and the external memory 220. The memory controller 150 may control the external memory 220 to write or read data at the request of the host. The host may be a master device such as the CPU 120 or the LCD controller 130.

The external memory 220 is a storage for storing data and may store an operating system (OS) as well as various kinds of programs and data. The external memory 220 may be implemented by DRAM, but inventive concepts are not restricted to these example embodiments. The external memory 220 may be implemented by non-volatile memory such as flash memory, phase-change RAM (PRAM), magnetoresistive RAM (MRAM), resistive RAM (ReRAM), ferroelectric RAM (FeRAM), etc. In other example embodiments, the external memory 220 may be embedded in the SoC 200.

The elements of the SoC 200 may communicate with one another through the bus.

The display device 230 may display multimedia loaded to the function block 120. According to at least this example embodiment, the display device 230 is an LCD device. However, inventive concepts are not restricted to this example embodiment. In at least some other example embodiments, the display device 230 may be a light emitting diode (LED) display device, an organic LED (OLED) display or one of other types of display devices.

The display device controller 130 controls the operations of the display device 230.

Figure 17:
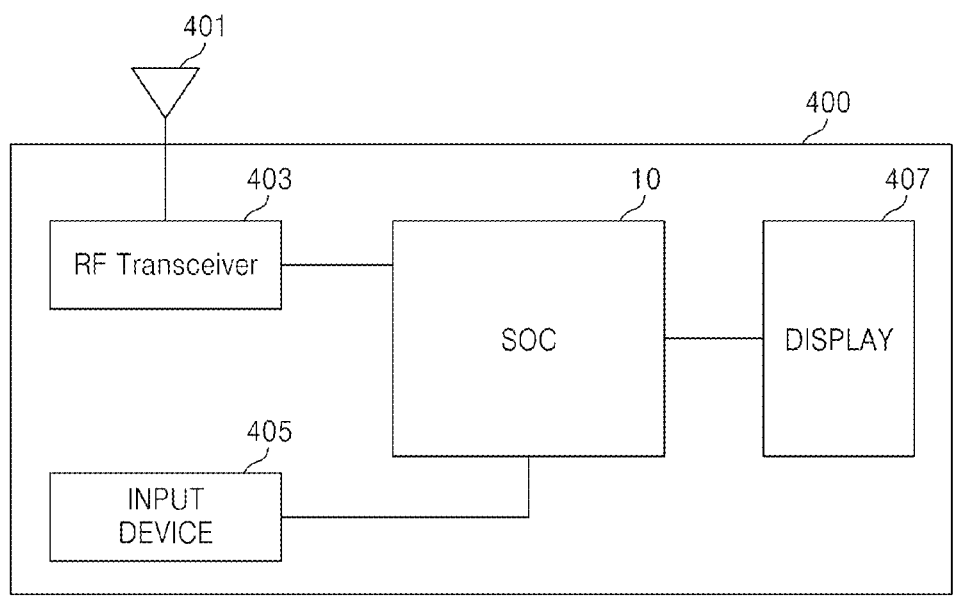
FIG. 17 is a block diagram of another example embodiment of a semiconductor system including the SoC illustrated in FIG. 1.

FIG. 17 is a block diagram of a semiconductor system 400 including the SoC 10 illustrated in FIG. 1 according to an example embodiment of inventive concepts. Although the semiconductor system 400 is shown in FIG. 17 as including the SoC 10, the semiconductor system 400 may include one or more SoCs according to any of the example embodiments described herein.

Referring to FIG. 17, the semiconductor system 400 includes the SoC 10 illustrated in FIG. 1, an antenna 401, a radio transceiver 403, an input device 405 and a display 407.

The radio transceiver 403 transmits and receives radio signals through the antenna 401. The radio transceiver 403 may convert radio signals received through the antenna 401 into signals that can be processed by the SoC 10. Accordingly, the SoC 10 may process the signals output from the radio transceiver 403 and transmit the processed signals to the display 407. And, the radio transceiver 403 may also convert signals output from the SoC 10 into radio signals and output the radio signals to an external device through the antenna 401.

The input device 405 enables control signals for controlling the operation of the SoC 10 or data to be processed by the SoC 10 to be input to the semiconductor system 400. The input device 405 may be implemented by a pointing device such as a touch pad or a computer mouse, a keypad, or a keyboard.

Figure 18:
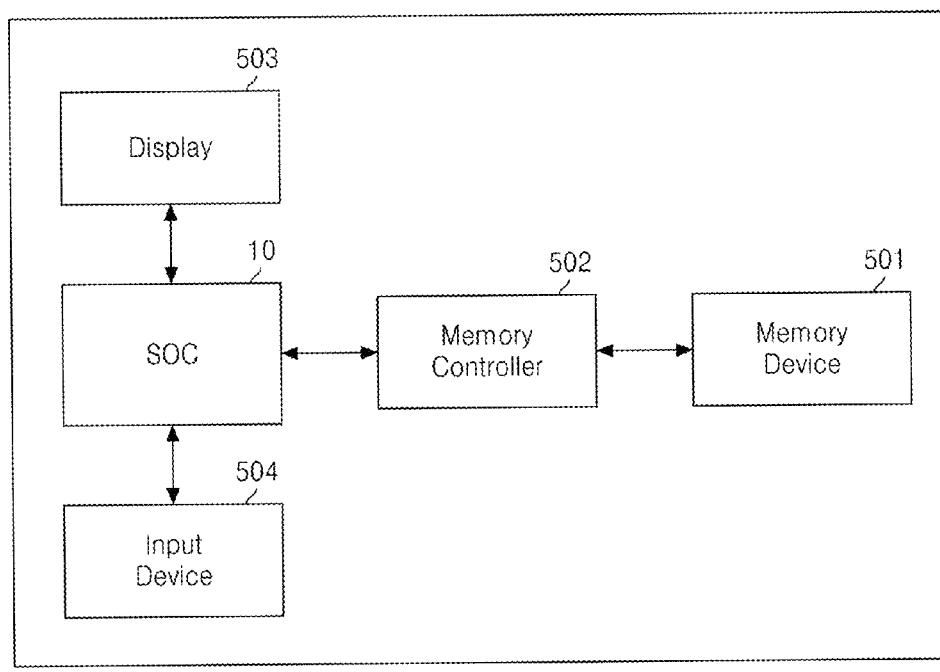
FIG. 18 is a block diagram of an example embodiment of a computer system including the SoC illustrated in FIG. 1.

FIG. 18 is a block diagram of a computer system 500 including the SoC 10 illustrated in FIG. 1 according to another example embodiment of inventive concepts. The computer system 500 may be implemented as a personal computer (PC), a tablet PC, a netbook, an e-reader, a PDA, a portable multimedia player (PMP), an MP3 player, an MP4 player, etc. Although the computer system 500 is shown in FIG. 16 as including the SoC 10, the computer system 500 may include one or more SoCs according to any of the example embodiments described herein.

The computer system 500 includes the SoC 10, a memory device 501, a memory controller 502 controlling the data processing operations of the memory device 501, a display 503 and an input device 504.

The SoC 10 may display data stored in the memory device 501 through a display 503 according to data input through an input device 504. The input device 504 may be implemented by a pointing device such as a touch pad or a computer mouse, a keypad, or a keyboard.

The SoC 10 may also control the overall operation of the computer system 500 and the operations of the memory controller 502. The memory controller 502, which may control the operations of the memory device 501, may be implemented as a part of the SoC 10 or as a separate chip.

Figure 19:
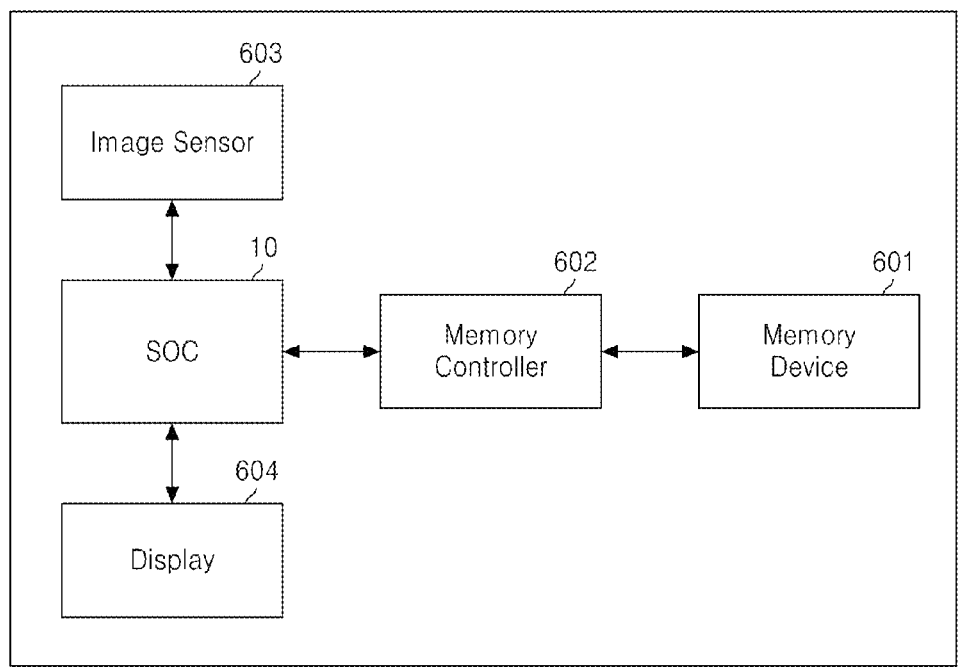
FIG. 19 is a block diagram of another example embodiment of a computer system including the SoC illustrated in FIG. 1.

FIG. 19 is a block diagram of a computer system 600 including the SoC 10 illustrated in FIG. 1 according to another example embodiment of inventive concepts. The computer system 600 may be implemented as an image processor of a digital camera, a cellular phone equipped with a digital camera, a smart phone equipped with a digital camera, a tablet PC equipped with a digital camera, or the like. Although the computer system 600 is shown in FIG. 19 as including the SoC 10, the computer system 600 may include one or more SoCs according to any of the example embodiments described herein.

The computer system 600 includes the SoC 10, a memory device 601 and a memory controller 602 controlling the data processing operations, such as a program operation, an erase operation, and a read operation, of the memory device 601. The computer system 600 further includes an image sensor 603 and a display 604.

The image sensor 603 included in the computer system 600 converts optical images into digital signals and outputs the digital signals to the SoC 10 or the memory controller 602. The digital signals may be controlled by the SoC 10 to be displayed through the display 604 or stored in the memory device 601 through the memory controller 602.

Data stored in the memory device 601 may be displayed through the display 604 according to the control of the SoC 10 or the memory controller 602. The memory controller 602, which may control the operations of the memory device 601, may be implemented as a part of the SoC 10 or as a separate chip.

Figure 20:
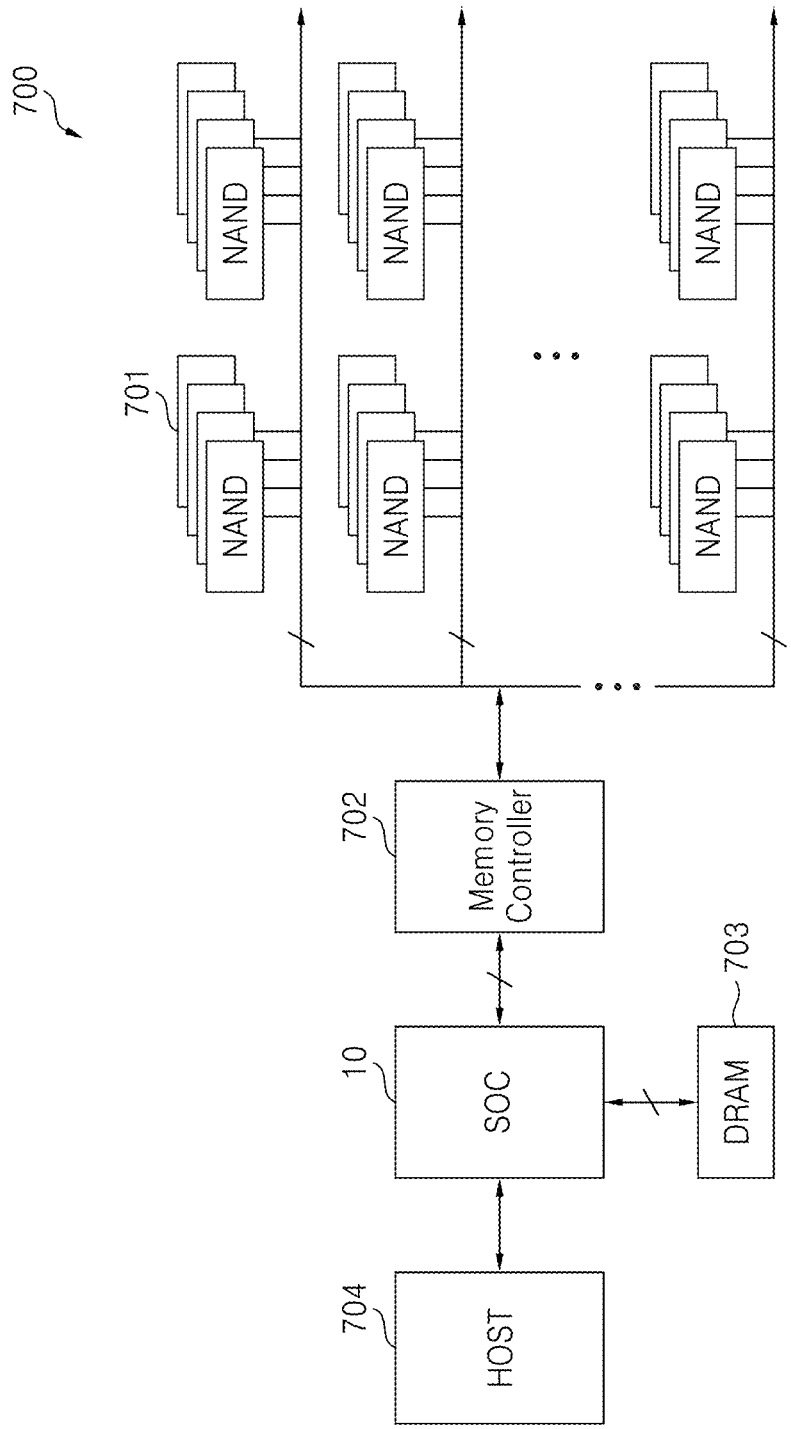
FIG. 20 is a block diagram of an example embodiment of a memory system including the SoC illustrated in FIG. 1.

FIG. 20 is a block diagram of a memory system 700 including the SoC 10 illustrated in FIG. 1 according to still another example embodiment of inventive concepts. The memory system 700 may be implemented as a data storage system, such as a solid state drive (SSD). Although the memory system 700 shown in FIG. 20 includes the SoC 10, the memory system 700 may include one or more SoCs according to any of the example embodiments described herein.

The memory system 700 includes a plurality of memory devices 701, a memory controller 702 controlling the data processing operations of the memory devices 701, a volatile memory device 703, such as a dynamic random access memory (DRAM), and the SoC 10 controlling data transferred between the memory controller 702 and a host 704 to be stored in the volatile memory device 703.

As mentioned above, example embodiments of inventive concepts may also be embodied as computer-readable codes stored on a computer-readable medium. The computer-readable recording medium may be any data storage device capable of storing data as a program, which can be thereafter read by a computer system. Examples of the computer-readable recording medium include read-only memory (ROM), random-access memory (RAM), CD-ROMs, magnetic tapes, floppy disks, and optical data storage devices. The computer-readable medium may also be distributed over network coupled computer systems so that the computer-readable code is stored and executed in a distributed fashion. Also, functional programs, codes, and code segments to accomplish the present inventive concepts can be easily construed by programmers.

Figure 21:
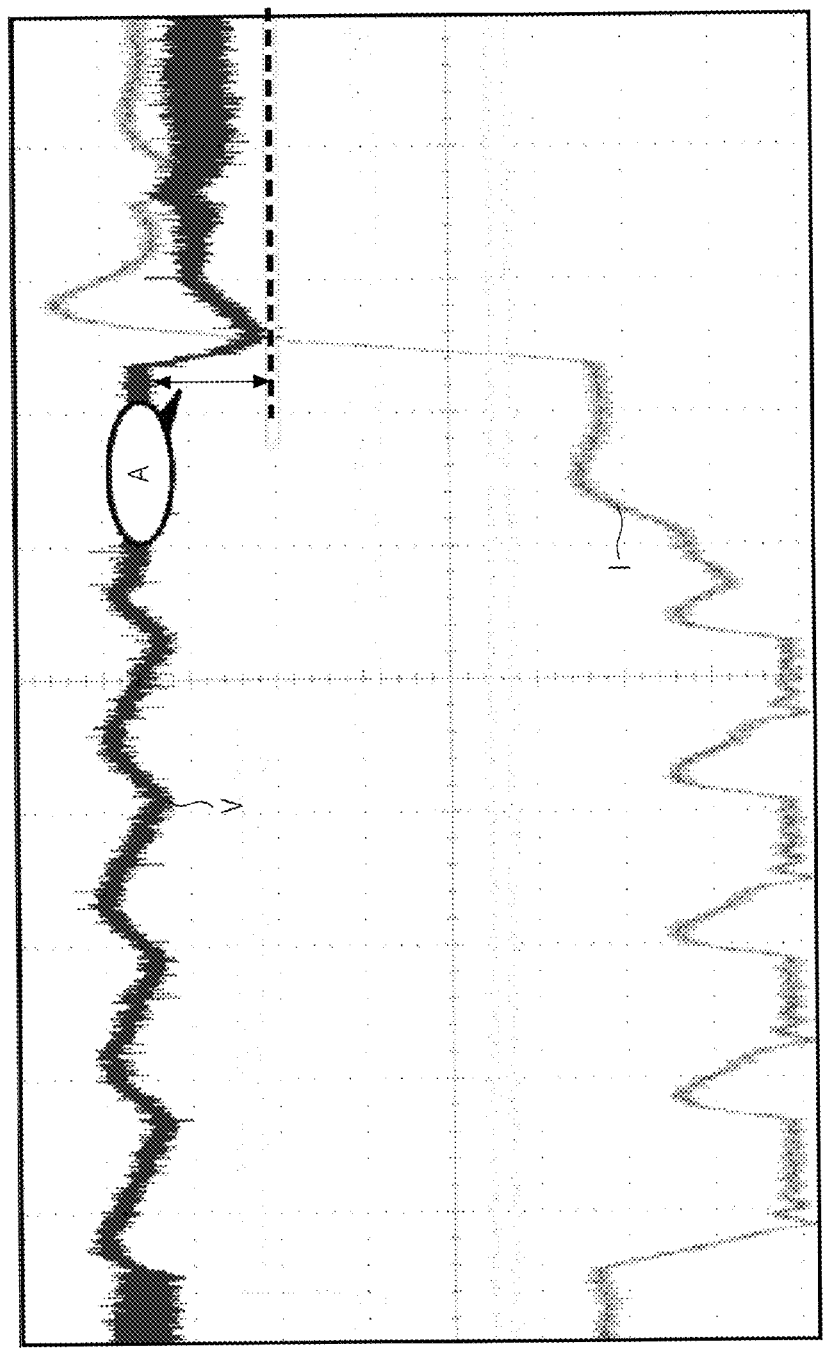
FIG. 21 is a graph showing example current and voltage when an operating clock signal is applied to a function block without taking into account the state of the function block.
Figure 22:
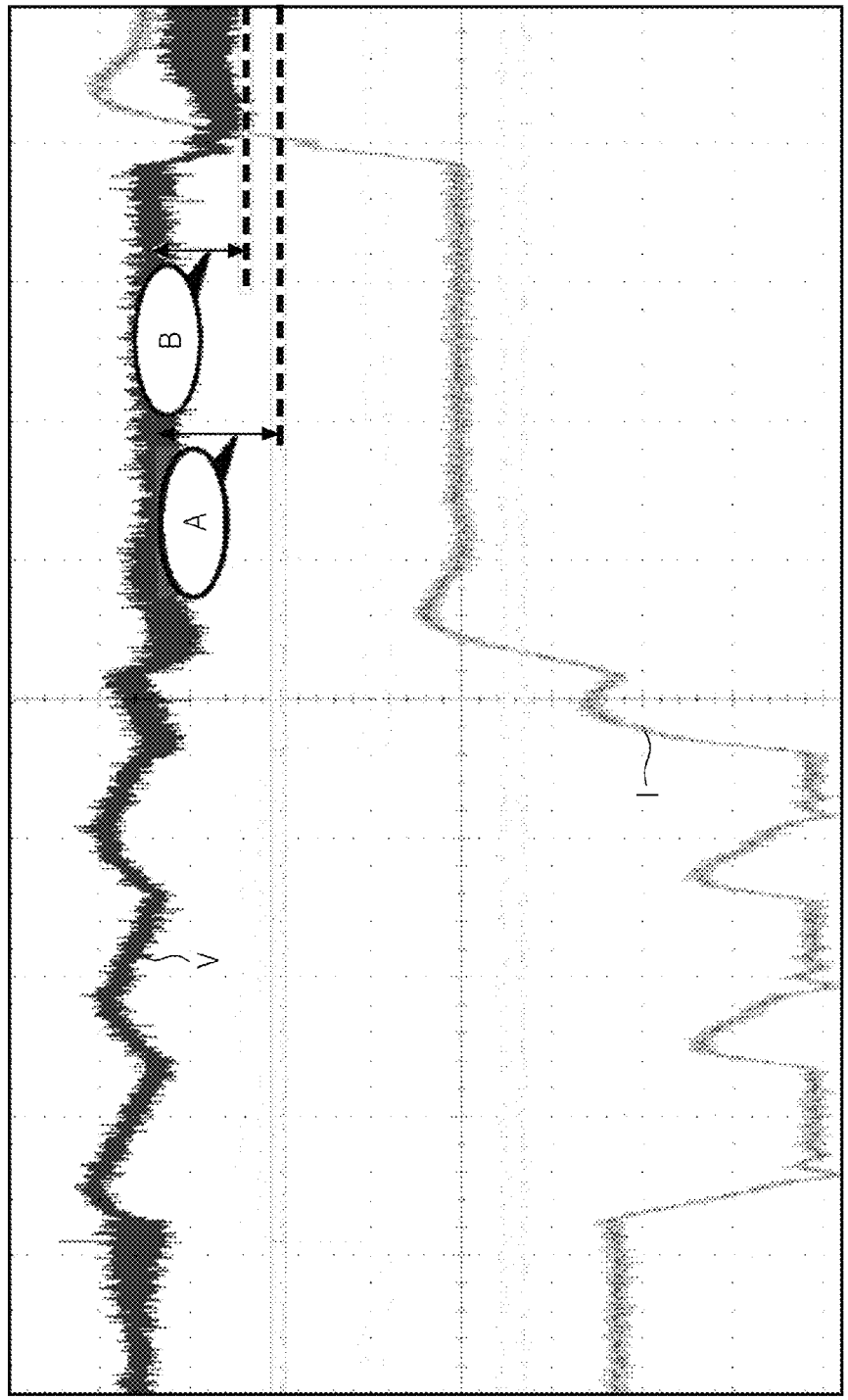
FIG. 22 is a graph showing example current and voltage when an operating clock signal is applied to a function block when taking into account the state of the function block.

FIG. 21 is a graph showing current and voltage when an operating clock signal is applied to the function block 120 without considering or taking into account the state of the function block 120. FIG. 22 is a graph showing current and voltage when an operating clock signal is applied to the function block 120 when considering (taking into account) the state of the function block 120.

Referring to FIG. 21, when the operating clock signal is applied to the function block 120 without considering the state of the function block 120, voltage drop A occurs. However, as shown in FIG. 22, when the operating clock signal with the third frequency is applied to the function block 120 at the transition of the function block 120 from an idle state to an active state, a voltage V is applied gradually to the function block 120, and therefore, voltage drop B is decreased as compared to the voltage drop A.

When the operating clock signal is applied to the function block 120 without considering the state of the function block 120, the operating clock signal with the active state frequency, which is much greater than the idle state frequency, is abruptly applied to the function block 120 and the slope of current I increases (e.g., rapidly increases) as shown in FIG. 21. However, when the operating clock signal with the wakeup state frequency is applied to the function block 120 after the function block 120 transitions from the idle state to the active state, the current I is gradually supplied to the function block 120, and therefore, the slope of the current I increases relatively modestly or slowly as shown in FIG. 22. As a result, the function block 120 operates normally without malfunction caused by the relatively large voltage drop A and/or the relatively rapid increase in the slope of the current I.

In at least some example embodiments of methods of controlling clock signals of SoCs, SoCs using the methods and semiconductor systems including the SoCs, an operating clock signal applied to each of a plurality of function blocks is separately controlled according to the state of each function block, so that unnecessary consumption of power is reduced. In addition, malfunctions that may occur when the function block transitions from an idle state to an active state is suppressed and/or prevented.

While inventive concepts have been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. A method of operating a system-on-chip including at least one function block, the method comprising:
    decreasing an operating frequency of the at least one function block in response to a change in an operating state of the at least one function block from an active state to an idle state, the decreased operating frequency being greater than zero;
    increasing the operating frequency of the at least one function block in response to a change in the operating state of the at least one function block from the idle state to the active state, the operating frequency of the at least one function block being increased from an idle mode operating frequency to a wakeup mode operating frequency, and then from the wakeup mode operating frequency to an active mode operating frequency in response to expiration of a first time period after the operating state of the at least one function block changes from the idle state to the active state.

2. The method of claim 1, wherein the decreasing of the operating frequency comprises:
    dividing a frequency of a reference clock for the system-on-chip according to a division factor associated with the idle state of the at least one function block; and wherein
    the operating frequency of the at least one function block is decreased to the divided frequency.

3. The method of claim 1, further comprising:
    setting the operating frequency of the at least one function block to the active mode operating frequency, the active mode operating frequency being a first clock frequency associated with the active state of the at least one function block; and wherein
    the operating frequency of the at least one function block is decreased from the active mode operating frequency to the idle mode operating frequency, the idle mode operating frequency being a second clock frequency associated with the idle state of the at least one function block.

4. The method of claim 1, wherein the decreasing of the operating frequency comprises:
    selecting a division factor from among a plurality of division factors, the selected division factor corresponding to the idle state; and
    setting the operating frequency of the at least one function block based on the selected division factor.

5. The method of claim 1, wherein the decreasing of the operating frequency comprises:
    selecting an operating clock from among a plurality of operating clocks based on the operating state of the at least one function block, the selected operating clock corresponding to the idle state.

6. A method of operating a system-on-chip including a function block, the method comprising:
    detecting a first change in an operating state of the function block from an active state to an idle state;
    decreasing an operating frequency of the function block in response to the detected first change, the decreased operating frequency being greater than zero;
    detecting a second change in the operating state of the function block from the idle state to the active state;
    increasing the operating frequency of the function block from an idle mode operating frequency to a wakeup mode operating frequency in response to the detected second change from the idle state to the active state; and
    increasing the operating frequency of the function block from the wakeup mode operating frequency to an active mode operating frequency in response to expiration of a first time period after the detected second change.

7. A system-on-chip comprising:
    a clock controller configured to,
        decrease an operating frequency of at least one function block in response to a change in an operating state of the at least one function block from an active state to an idle state, the decreased operating frequency being greater than zero,
        increase the operating frequency of the at least one function block from an idle mode operating frequency to a first wakeup mode operating frequency in response to a change in the operating state of the at least one function block from the idle state to the active state, and
        increase the operating frequency of the at least one function block from the first wakeup mode operating frequency to an active mode operating frequency in response to expiration of a first time period after the operating state of the at least one function block changes from the idle state to the active state.

8. The system-on-chip of claim 7, wherein the clock controller comprises:
    a divider circuit configured to divide a frequency of a reference clock for the system-on-chip according to a division factor associated with the idle state of the at least one function block to set the operating frequency of the at least one function block.

9. The system-on-chip of claim 7, wherein the clock controller is further configured to set the operating frequency of the at least one function block to the active mode operating frequency, the active mode operating frequency being a first clock frequency associated with the active state of the at least one function block, and wherein the clock controller is configured to decrease the operating frequency of the at least one function block from the active mode operating frequency to the idle mode operating frequency, the idle mode operating frequency being associated with the idle state of the at least one function block.

10. The system-on-chip of claim 7, wherein the clock controller comprises:
    a mode detector configured to detect the operating state of the at least one function block; and
    a selection circuit configured to select one of a plurality of division factors based on the detected operating state of the at least one function block; wherein the clock controller is further configured to set the operating frequency of the function block based on the selected division factor.

11. The system-on-chip of claim 10, wherein the clock controller further comprises:
a divider circuit configured to divide a frequency of a reference clock based on the selected division factor to set the operating frequency of the at least one function block.

12. The system-on-chip of claim 10, wherein the mode detector is further configured to generate a selection signal based on the detected operating state of the at least one function block, and wherein the selection circuit is further configured to select the one of the plurality of division factors based on the selection signal.

13. The system-on-chip of claim 10, further comprising:
a register block configured to store the plurality of division factors, wherein the selection circuit is configured to select the one of the plurality of division factors from the register block.

14. The system-on-chip of claim 13, wherein the clock controller comprises:
a divider circuit configured to divide a frequency of a reference clock based on the selected division factor to set the operating frequency of the at least one function block.

15. The system-on-chip of claim 13, wherein the mode detector is further configured to generate a select signal based on the detected operating state of the at least one function block, and wherein the selection circuit is further configured to select one of the plurality of division factors from the register block based on the select signal.

16. The system-on-chip of claim 7, further comprising:
a mode detector configured to detect the operating state of the at least one function block; and
a look-up table configured to store a plurality of division factors, the look-up table being further configured to output one of the plurality of division factors based on the detected operating state, wherein
the clock controller is further configured to set the operating frequency of the at least one function block based on the output division factor.

17. The system-on-chip of claim 16, wherein the clock controller comprises:
a divider circuit configured to divide a frequency of a reference clock based on the output division factor to set the operating frequency of the at least one function block.

18. The system-on-chip of claim 16, wherein the mode detector is further configured to generate a select signal based on the detected operating state of the function block, and wherein the look-up table is further configured to output the one of the plurality of division factors based on the select signal.

19. The system-on-chip of claim 7, further comprising:
a selection circuit configured to select one of a plurality of operating clocks based on the operating state of the at least one function block; wherein
the clock controller is further configured to set the operating frequency to a frequency of the selected operating clock.

20. The system-on-chip of claim 19, further comprising:
a plurality of phase-locked-loop (PLL) circuits configured to generate the plurality of operating clocks, each of the plurality of operating clocks having an operating frequency from among a plurality of operating frequencies.

21. The system-on-chip of claim 7, wherein the clock controller comprises:
a mode detector circuit configured to detect the change in the operating state of the at least one function block from the idle state to the active state; and wherein
the clock controller is further configured to increase the operating frequency of the at least one function block from the idle mode operating frequency to the first wakeup mode operating frequency in response to the detected change from the idle state to the active state.

22. The system-on-chip of claim 21, wherein the clock controller is configured to increase the operating frequency gradually.

23. The system-on-chip of claim 7, wherein the increase in the operating frequency from the first wakeup mode operating frequency to the active mode operating frequency is triggered by a voltage detector.

24. The system on chip of claim 7, wherein the clock controller is further configured to increase the operating frequency from the first wakeup mode operating frequency to a second wakeup mode operating frequency, and then from the second wakeup mode operating frequency to the active mode operating frequency after expiration of the first time period.

25. The system-on-chip of claim 7, wherein the clock controller is further configured to,
increase the operating frequency from the first wakeup mode operating frequency to a second wakeup mode operating frequency after expiration of a second time period after increasing the operating frequency from the idle mode operating frequency to the first wakeup mode operating frequency, but before expiration of the first time period, and
increase the operating frequency from the second wakeup mode operating frequency to the active mode operating frequency in response to expiration of the first time period.

26. A system-on-chip comprising:
a mode detector circuit configured to detect a change in an operating state of a function block, the mode detector circuit being further configured to generate a select signal based on the detected change in the operating state; and
an operating frequency setting circuit configured to set an operating frequency of the function block based on the select signal from the mode detector circuit; wherein
the operating frequency setting circuit is configured to decrease the operating frequency of the function block if the select signal is indicative of a change from an active operating state to an idle operating state, the decreased operating frequency being greater than zero,
the operating frequency setting circuit is configured to increase the operating frequency of the function block from an idle mode operating frequency to a first wakeup mode operating frequency if the select signal is indicative of a change from the idle operating state to the active operating state, and
the operating frequency setting circuit is configured to increase the operating frequency of the function block from the first wakeup mode operating frequency to an active mode operating frequency in response to expiration of a first time period after the operating state of the at least one function block changes from the idle operating state to the active operating state.

27. The system-on-chip of claim 26, wherein, the operating frequency setting circuit is configured to increase the operating frequency of the function block from the first wakeup mode operating frequency to a second wakeup mode operating frequency, and then from the second wakeup mode operating frequency to the active mode operating frequency after expiration of the first time period.

28. The system-on-chip of claim 27, wherein the operating frequency setting circuit is further configured to,
increase the operating frequency from the first wakeup mode operating frequency to a second wakeup mode operating frequency after expiration of a second time period after the change in the operating state of the function block from the idle operating state to the active operating state, but before expiration of the first time period, and
increase the operating frequency from the second wakeup mode operating frequency to the active mode operating frequency in response to expiration of the first time period.

29. The system-on-chip of claim 26, wherein the operating frequency setting circuit comprises:
a divider circuit configured to divide a frequency of a reference clock for the system-on-chip according to a division factor associated with the operating state of the function block to set the operating frequency of the function block.

30. The system-on-chip of claim 26, wherein the operating frequency setting circuit comprises:
a selection circuit configured to select one of a plurality of division factors based on the select signal; and wherein
the operating frequency setting circuit is configured to set the operating frequency of the function block based on the selected division factor.

31. The system-on-chip of claim 30, wherein the operating frequency setting circuit comprises:
a divider circuit configured to divide a frequency of a reference clock based on the selected division factor to set the operating frequency of the function block.

32. The system-on-chip of claim 30, wherein the operating frequency setting circuit further comprises:
a register block configured to store the plurality of division factors, wherein
the selection circuit is configured to select the one of a plurality of division factors from the register block.

33. The system-on-chip of claim 32, wherein the operating frequency setting circuit further comprises:
a divider circuit configured to divide a frequency of a reference clock based on the selected division factor to set the operating frequency of the function block.

34. The system-on-chip of claim 26, further comprising:
a look-up table configured to store a plurality of division factors, the look-up table being further configured to output a selected one of the plurality of division factors in response to the select signal, wherein
the operating frequency setting circuit is configured to set the operating frequency of the function block based on the selected division factor.

35. The system-on-chip of claim 34, wherein the operating frequency setting circuit further comprises:
a divider circuit configured to divide a frequency of a reference clock based on the selected division factor to set the operating frequency of the function block.

* * * * *